(12) United States Patent
Nishimura et al.

(10) Patent No.: US 8,542,222 B2
(45) Date of Patent: Sep. 24, 2013

(54) DIFFERENTIAL AMPLIFIER CIRCUIT, DATA LINE DRIVER USING THE SAME, AND LIQUID CRYSTAL DISPLAY APPARATUS

(75) Inventors: Kouichi Nishimura, Kanagawa (JP); Toshikazu Murata, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 565 days.

(21) Appl. No.: 12/822,832

(22) Filed: Jun. 24, 2010

(65) Prior Publication Data

US 2011/0025654 A1 Feb. 3, 2011

(30) Foreign Application Priority Data

Jul. 30, 2009 (JP) ................. 2009-178218

(51) Int. Cl.
*G06G 5/00* (2006.01)
(52) U.S. Cl.
USPC .............................. 345/204; 345/87; 330/257
(58) Field of Classification Search
None
See application file for complete search history.

(56) References Cited

U.S. PATENT DOCUMENTS

| | | | |
|---|---|---|---|
| 5,311,145 A | 5/1994 | Huijsing et al. | |
| 6,208,208 B1 * | 3/2001 | Komatsu et al. | 330/255 |
| 7,310,017 B2 * | 12/2007 | Etou | 330/253 |
| 7,683,714 B2 | 3/2010 | Nishimura et al. | |

FOREIGN PATENT DOCUMENTS

| | | |
|---|---|---|
| JP | 6-326529 A | 11/1994 |
| JP | 2005-333624 A | 12/2005 |
| JP | 2007-202127 A | 8/2007 |

* cited by examiner

*Primary Examiner* — Jason Olson
(74) *Attorney, Agent, or Firm* — Foley & Lardner LLP

(57) ABSTRACT

A differential amplifier circuit includes: an NMOS transistor pair connected with a non-inversion input terminal and an inversion input terminal; a PMOS transistor pair connected with the non-inversion input terminal and the inversion input terminal; and an output circuit section. The PMOS transistor pair includes first and second PMOS transistors, and the NMOS transistor pair includes first and second non-doped type NMOS transistors as a depletion type of NMOS transistors in which a channel region is formed in a P-type substrate without a P well. The output circuit section includes a first current mirror of a folded cascode type connected with the first and second non-doped type NMOS transistors, and outputs an output voltage in response to a current from the first current mirror.

15 Claims, 15 Drawing Sheets

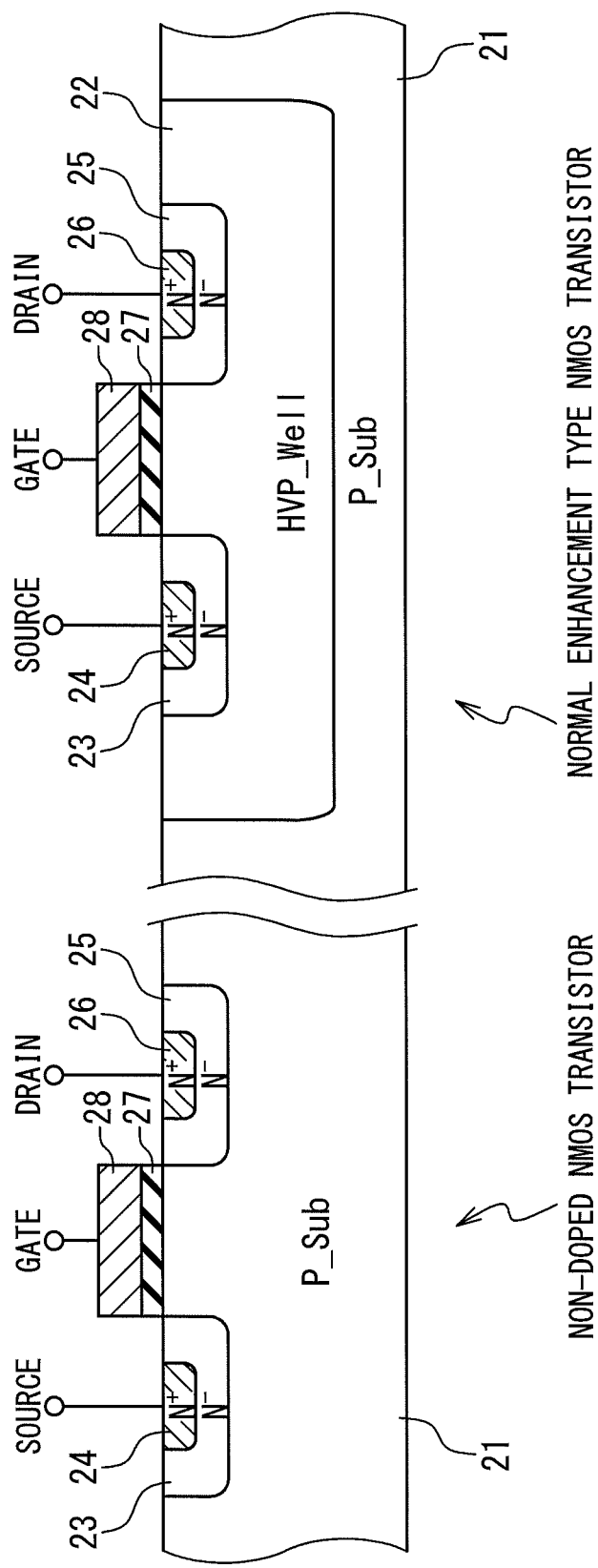

CONVENTIONAL CIRCUIT (FIG. 1)

INVENTION (FIG. 5)

US 8,542,222 B2

DIFFERENTIAL AMPLIFIER CIRCUIT, DATA LINE DRIVER USING THE SAME, AND LIQUID CRYSTAL DISPLAY APPARATUS

INCORPORATION BY REFERENCE

This patent application claims a priority on convention based on Japanese Patent Application No. 2009-178218 filed on Jul. 30, 2009. The disclosure thereof is incorporated herein by reference.

TECHNICAL FIELD

The present invention relates to a differential amplifier circuit, to a data line driver using the same and a liquid crystal display apparatus.

BACKGROUND ART

A differential amplifier circuit is generally used in an output stage of a data line driver for driving data lines (i.e., signal lines) of a liquid crystal display panel. This is because the data lines provided in the liquid crystal display panel are long in length and have large parasitic capacities, and therefore large driving power is required for driving the data lines. Most typically, a voltage follower including a differential amplifier circuit is provided in the output stage so that the data lines are driven by the voltage follower.

In many cases, the differential amplifier circuit provided in the output stage of the data line driver is configured to adapt to a Rail-to-Rail operation. In other words, the differential amplifier circuit is configured in such a manner that a lower limit of a permissible range of input and output voltages is as near to a ground voltage as possible and an upper limit of the permissible range thereof is as near to a power supply voltage as possible. This requirement is particularly important to extend an operation voltage range in a case of a low power supply voltage.

One of the technical aspects to be taken into consideration in realizing the Rail-to-Rail operation is an operation voltage range of a differential pair including (an enhancement type of) NMOS transistor (to be referred to as "NMOS transistor pair" hereinafter) and of a differential pair including PMOS transistors (to be referred to as "PMOS transistor pair" hereinafter). The NMOS transistor pair is adapted for an input voltage equal to or higher than a threshold voltage $V_{TN}$ of the NMOS transistors and equal to or lower than the power supply voltage $V_{DD}$. Whereas, the PMOS transistor pair is adapted for an input voltage equal to or higher than a ground voltage $V_{SS}$ and equal to or lower than ($V_{DD}$–$V_{TP}$), where $V_{TP}$ is a threshold voltage of the PMOS transistors.

In consideration of such characteristics of the transistors differential pair, the differential amplifier circuit performing the Rail-to-Rail operation is typically configured to include both of the NMOS transistor pair and the PMOS transistor pair. The differential amplifier circuit like this is disclosed in, for example, patent literature 1.

FIG. 1 is a circuit diagram showing a configuration of the differential amplifier circuit disclosed in the patent literature 1. In FIG. 1, the differential amplifier circuit 101 includes an NMOS transistor pair 102, a PMOS transistor pair 103, constant current sources $I_{S1}$ and $I_{S2}$, current mirrors 104 and 105, a floating current source 106, a constant current source $I_{S3}$, a PMOS transistor MP$_8$, an NMOS transistor MN$_8$, and phase compensating capacitors $C_1$ and $C_2$. The NMOS transistor pair 102 includes a pair of NMOS transistors MN$_{101}$ and MN$_{102}$, and the PMOS transistor pair 103 includes a pair of PMOS transistors MP$_1$ and MP$_2$. Each of the current mirrors 104 and 105 is a folded-cascode type current mirror. The current mirror 104 includes PMOS transistors MP$_3$ to MP$_6$, and the current mirror 105 includes NMOS transistors MN$_3$ to MN$_6$. A bias voltage $V_1$ is supplied to the PMOS transistors MP$_5$ and MP$_6$, and a bias voltage $V_2$ is supplied to the NMOS transistors MN$_5$ and MN$_6$. The floating current source 106 includes a PMOS transistor MP$_7$ and an NMOS transistor MN$_7$. A bias voltage $V_3$ is supplied to a gate of the PMOS transistor MP$_7$, and a bias voltage $V_4$ is supplied to a gate of the NMOS transistor MN$_7$. A PMOS transistor MP$_8$ and an NMOS transistor MN$_8$ are connected in series between a power supply line 107 and a ground line 108, and they act as output transistors.

The differential amplifier circuit 101 configured as mentioned above generates an output voltage Vout corresponding to a difference between an input voltage In$^+$ supplied to a non-inversion input terminal 109 and an input voltage In$^-$ supplied to an inversion input terminal 110, to output to an output terminal 111. Since the differential amplifier circuit 101 in FIG. 1 includes both of the NMOS transistor pair 102 and the PMOS transistor pair 103 in the input stage thereof, the Rail-to-Rail operation can be realized.

However, when the differential amplifier circuit 101 in FIG. 1 is used as a driver of a liquid crystal display panel, there arises a problem of aggravation of an amplitude difference deviation in a voltage range in the vicinity of the power supply voltage $V_{DD}$ or the ground voltage $V_{SS}$ although the Rail-to-Rail operation can be realized. Herein, the amplitude difference deviation means a deviation of a difference (amplitude difference) between a positive driving voltage and a negative driving voltage for the same gray scale when multiple differential amplifier circuits are provided. This problem is pointed out in patent literature 2. In this patent literature 2, it is concluded that a cause of aggravation of the amplitude difference deviation in a voltage range in the vicinity of the power supply voltage $V_{DD}$ or the ground voltage $V_{SS}$ is due to difference in the circuit operation between an intermediate voltage range and the voltage range in the vicinity of the power supply voltage $V_{DD}$ or the ground voltage $V_{SS}$ since the differential amplifier circuit 101 in FIG. 1 is provided with both of the NMOS transistor pair and the PMOS transistor pair (see Paragraph [0125] in the patent literature 2). Specifically, in the intermediate voltage range, both of the NMOS transistor pair and the PMOS transistor pair operate. Whereas, in the voltage range in the vicinity of the power supply voltage $V_{DD}$, although the NMOS transistor pair operates, the PMOS transistor pair does not operate. Meanwhile, in the voltage range in the vicinity of the ground voltage $V_{SS}$, while the PMOS transistor pair operates, the NMOS transistor pair does not operate. Switching in these operations causes an increase of an amplitude difference deviation in the voltage range in the vicinity of the power supply voltage $V_{DD}$ or the ground voltage $V_{SS}$.

In the patent literature 2, as a measure for solving the problem of the amplitude difference deviation in the voltage range in the vicinity of the power supply voltage $V_{DD}$ or the ground voltage $V_{SS}$, it is disclosed that only a differential pair of depletion-type NMOS transistors is used and a folded-type load circuit is further used as an active load. FIGS. 2 and 3 are circuit diagrams showing configurations of differential amplifier circuits 101A and 101B disclosed in the patent literature 2. The differential amplifier circuit 101A in FIG. 2 is configured to include a NMOS transistor pair 102A, a current mirror 104, constant current sources $I_{S1}$ to $I_{S3}$, and an output amplifier A1. The NMOS transistor pair 102A includes a pair of depletion-type NMOS transistors MN$_1$ and MN$_2$. Herein, each of the depletion-type NMOS transistors is depicted by adding a circle mark to a symbol of a usual NMOS transistor. Meanwhile, a folded cascode type current mirror is used as the current mirror 104 acting as an active load. It should be noted that a voltage source for supplying a bias voltage V$_1$ is designated by a reference numeral 112 in FIG. 2. On the other hand, the differential amplifier circuit 101B in FIG. 3 is configured to include a NMOS transistor pair 102A, a current mirror 104, constant current sources I$_{S1}$ to I$_{S3}$, a floating current source 106, a current mirror 105A, a PMOS transistor MP$_8$, and an NMOS transistor MN$_8$. Also, in the circuit configuration in FIG. 3, a folded cascode type current mirror is used as the current mirror 104. Voltage sources for supplying the bias voltages V$_3$ and V$_4$ are respectively designated by reference numerals 114 and 115 in FIG. 3.

In the configurations shown in FIGS. 2 and 3, by using the NMOS transistor pair 102A including a pair of depletion-type NMOS transistors MN$_1$ and MN$_2$, a lower limit of the input voltage can adapt for the ground voltage V$_{SS}$. Further, by using the folded cascode type current mirror 104 as a load circuit, a bias voltage required for operating the depletion-type NMOS transistors of the NMOS transistor pair 102A can be supplied even when the input voltage is in the voltage range in the vicinity of the power supply voltage V$_{DD}$. Thus, the NMOS transistor pair 102A operates in the entire voltage range without occurrence of switching in the circuit operation. Therefore, according to the configurations shown in FIGS. 2 and 3, while the Rail-to-Rail operation can be realized, the amplitude difference deviation in the voltage range in the vicinity of the power supply voltage V$_{DD}$ and the ground voltage V$_{SS}$ can be reduced.

It should be noted that only the depletion-type NMOS transistor pair is provided in each of the configurations in FIGS. 2 and 3 without providing the PMOS transistor pair therein. The configuration disclosed in the patent literature 2 is based on a technical knowledge that only the depletion-type NMOS transistor pair is used in consideration of a defect that switching in the circuit operation occurs when the NMOS transistor pair and the PMOS transistor pair are both provided.

Citation List:
[patent literature 1]: JP-A-Heisei 6-326529
[patent literature 2]: JP 2007-202127A

SUMMARY OF THE INVENTION

However, according to a study of the inventor of this application, any of the circuit configurations in FIGS. 1 to 3 is not proper for realizing the amplitude difference deviation actually required for the data line driver to drive the liquid crystal display panel. A small amplitude difference deviation is required for a differential amplifier circuit used in an output stage of the data line driver, particularly in an intermediate voltage range. This requirement is due to characteristics of a liquid crystal. As understood from FIG. 4 schematically showing a relation between an applied voltage to a liquid crystal of each pixel and a luminance of a pixel, the curve of the relation between the applied voltage (V) and the luminance (T) of the pixel (to be referred to as "V-T curve" hereinafter) has a slope which is gradual in voltage ranges in the vicinity of the upper and lower limits of the applied voltage and is sharp in the intermediate voltage range. This implies that it is highly necessary to precisely control the applied voltage in the intermediate voltage range, that is, it is highly necessary to reduce the amplitude difference deviation of the differential amplifier circuit. However, this does not imply that there is no necessity of reducing the amplitude difference deviation in the voltage ranges in the vicinity of upper and lower limits of the applied voltage. In other words, the curve shown in FIG. 4 implies that, although it is desired to reduce the amplitude difference deviation in the whole voltage range, the amplitude difference deviation is required to be reduced particularly in the intermediate voltage range.

However, the configurations shown in FIGS. 1 to 3 do not satisfy the requirement as mentioned above. In the differential amplifier circuit using both of the NMOS transistor pair 102 and the PMOS transistor pair 103 as shown in FIG. 1, it is not possible to reduce the amplitude difference deviation in the voltage ranges in the vicinity of the power supply voltage V$_{DD}$ and the ground voltage V$_{SS}$. This is because switching of the circuit operation occurs in the voltage ranges in the vicinity of the power supply voltage V$_{DD}$ and the ground voltage V$_{SS}$ as described above. Whereas, in the configurations using only the NMOS transistor pair 102A including the depletion-type NMOS transistors as shown in FIGS. 2 and 3, although it is possible to reduce the amplitude difference deviation in the voltage ranges in the vicinity of the power supply voltage V$_{DD}$ and the ground voltage V$_{SS}$, it is not possible to reduce the amplitude difference deviation in a most important intermediate voltage range.

In an aspect of the present invention, a differential amplifier circuit includes: an NMOS transistor pair connected with a non-inversion input terminal and an inversion input terminal; a PMOS transistor pair connected with the non-inversion input terminal and the inversion input terminal; and an output circuit section. The PMOS transistor pair includes first and second PMOS transistors, and the NMOS transistor pair includes first and second non-doped type NMOS transistors as a depletion type of NMOS transistors in which a channel region is formed in a P-type substrate without a P well. The output circuit section includes a first current mirror of a folded cascode type connected with the first and second non-doped type NMOS transistors, and outputs an output voltage in response to a current from the first current mirror.

In another aspect of the present invention, a data line driver includes: a D/A (digital-to-analog) converter configured to output a gray scale voltage corresponding to a display data; and a differential amplifier circuit having an output terminal connected with a data line of a liquid crystal display panel, and having a non-inversion input terminal connected with the gray scale voltage and an inversion input terminal connected with the output terminal. The differential amplifier circuit includes: an NMOS transistor pair connected with the non-inversion input terminal and the inversion input terminal; a PMOS transistor pair connected with the non-inversion input terminal and the inversion input terminal; and an output circuit section. The PMOS transistor pair includes first and second PMOS transistors, and the NMOS transistor pair includes first and second non-doped type NMOS transistors as a depletion type of NMOS transistors in which a channel region is formed in a P-type substrate without a P well. The output circuit section includes a first current mirror of a folded cascode type connected with the first and second non-doped type NMOS transistors, and outputs an output voltage to the output terminal in response to a current from the first current mirror.

In a still another aspect of the present invention, a liquid crystal display apparatus includes: a liquid crystal display panel; and a data line driver configured to drive a data line of the liquid crystal display panel. The data line driver includes: a D/A (digital-to-analog) converter configured to output a gray scale voltage corresponding to a display data; and a differential amplifier circuit including an output terminal connected with the data line of a liquid crystal display panel, and having a non-inversion input terminal connected with the gray scale voltage and an inversion input terminal connected with the output terminal. The differential amplifier circuit includes: an NMOS transistor pair connected with the non-inversion input terminal and the inversion input terminal; a PMOS transistor pair connected with the non-inversion input terminal and the inversion input terminal; and an output circuit section. The PMOS transistor pair includes first and second PMOS transistors, and the NMOS transistor pair includes first and second non-doped type NMOS transistors as a depletion type of NMOS transistors in which a channel region is formed in a P-type substrate without a P well. The output circuit section includes a first current mirror of a folded cascode type connected with the first and second non-doped type NMOS transistors, and outputs an output voltage to the output terminal in response to a current from the first current mirror.

According to the present invention, it becomes possible to accomplish amplitude difference deviation characteristics excellently suited for a differential amplifier circuit used in a data line driver for driving a liquid crystal panel.

BRIEF DESCRIPTION OF THE DRAWINGS

The above and other objects, advantages and features of the present invention will be more apparent from the following description of certain embodiments taken in conjunction with the accompanying drawings, in which:

FIG. 6 shows sectional views showing configurations of a normal enhancement type NMOS transistor and a non-doped type NMOS transistor;

DESCRIPTION OF EMBODIMENTS

Figure 5:
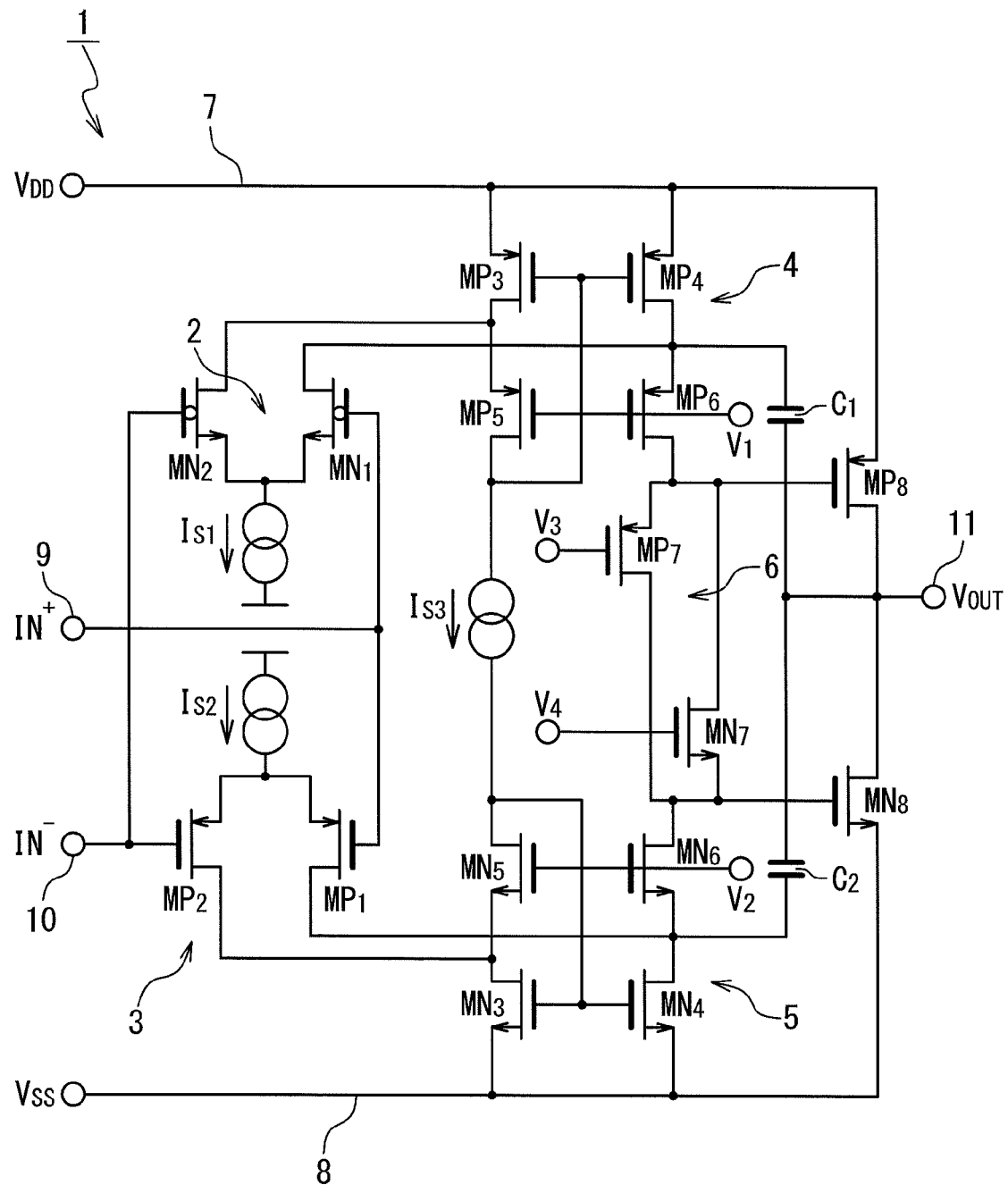
FIG. 5 is a circuit diagram showing a configuration of a differential amplifier circuit according to an embodiment of the present invention.

FIG. 5 is a circuit diagram showing a configuration of a differential amplifier circuit 1 according to an embodiment of the present invention. The differential amplifier circuit 1 includes an NMOS transistor pair 2, a PMOS transistor pair 3, constant current sources $I_{S1}$ and $I_{S2}$, current mirrors 4 and 5, a floating current source 6, a constant current source $I_{S3}$, a PMOS transistor $MP_8$, an NMOS transistor $MN_8$, and phase compensating capacitors $C_1$ and $C_2$. The NMOS transistor pair 2, the PMOS transistor pair 3 and the constant current sources $I_{S1}$ and $I_{S2}$ function as an input stage of the differential amplifier circuit 1. Meanwhile, the current mirrors 4 and 5, the floating current source 6, the constant current source $I_{S3}$, the PMOS transistor $MP_8$ and the NMOS transistor $MN_8$ function as an output circuit section of the differential amplifier circuit 1.

Specifically, the NMOS transistor pair 2 includes a pair of NMOS transistors $MN_1$ and $MN_2$, and the PMOS transistor pair 3 includes a pair of PMOS transistors $MP_1$ and $MP_2$. The NMOS transistors $MN_1$ and $MN_2$ have their sources connected in common to the constant current source $I_{S1}$ and the PMOS transistors $MP_1$ and $MP_2$ have their sources connected in common to the constant current source $I_{S2}$. The constant current source $I_{S1}$ supplies a predetermined current from the commonly connected sources of the NMOS transistors $MN_1$ and $MN_2$ to a ground line. The constant current source $I_{S2}$ supplies a predetermined current to the commonly connected sources of the PMOS transistors $MP_1$ and $MP_2$. The NMOS transistor $MN_1$ and the PMOS transistor $MP_1$ have their gates connected in common to a non-inversion input terminal 9, and the NMOS transistor $MN_2$ and the PMOS transistor $MP_2$ have their gates connected in common to an inversion input terminal 10.

Non-doped type NMOS transistors are used as the NMOS transistors $MN_1$ and $MN_2$ of the NMOS transistor pair 2. Herein, the non-doped type transistor means an NMOS transistor formed in a P-type substrate not a P-type well. In other words, the non-doped type transistor is an NMOS transistor with its channel region having a same impurity concentration as that of a P-type substrate. In FIG. 5 (and the other drawings), it should be noted that the non-doped type transistor is depicted to have a symbol added with a circle to a symbol of a normal NMOS transistor. In order to attain a preferable amplitude difference deviation characteristic, it is important to use the non-doped type NMOS transistors for the NMOS transistor pair 2, as to be described later.

FIG. 6 is a sectional view showing the structure of an enhancement type NMOS transistor and the non-doped type NMOS transistor. Each of the enhancement type NMOS transistor and the non-doped type NMOS transistor is formed on the P-type substrate 21. A P well 22 is formed by high-voltage implantation in the enhancement type NMOS transistor. N-regions 23 and 25 are formed in the P well 22, and a source region 24 is formed in the N-region 23 and a drain region 26 is formed in the N-region 25. A gate insulating film 27 is formed on the channel region of the P well 22, and a gate electrode 28 is formed on the gate insulating film 27. In the enhancement type NMOS transistor, channel implantation is performed to a channel region so that a threshold voltage is adjusted to be a desired value.

Meanwhile, the P well 22 is not formed for the non-doped type NMOS transistor. That is, N-regions 23 and 25 are directly formed in the P-type substrate 21, and a source region 24 is formed in the N-region 23 and a drain region 26 is formed in the N-region 25. Further, a gate insulating film 27 is formed on the channel region, and a gate electrode 28 is formed on the gate insulating film 27. In this configuration, it should be noted that, since a P well 22 is not formed for the non-doped type NMOS transistor, the impurity concentration in the channel region is coincident with the impurity concentration of the P-type substrate 21. The non-doped type NMOS transistor has a mutual conductance larger than that of a normal enhancement type NMOS transistor, as to be described later.

In the present embodiment, the impurity concentration in the P-type substrate 21 (i.e., the impurity concentration in the channel region of the non-doped type NMOS transistor) is set in such a manner that the threshold voltage of the non-doped type NMOS transistor can be adjusted to be approximately −0.1 V (in a range of −0.2 V to 0 V). Thus, the NMOS transistors $MN_1$ and $MN_2$ act as depletion type transistors.

Referring back to FIG. 5, the current mirror 4 is a folded-cascode type current mirror, which includes PMOS transistors $MP_3$ to $MP_6$. Specifically, the sources of the PMOS transistors $MP_3$ and $MP_4$ are connected to a power supply line 7 which is supplied with a power supply voltage $V_{DD}$, and the gates of the PMOS transistors $MP_3$ and $MP_4$ are connected in common to a drain of the PMOS transistors $MP_5$. The drains of the PMOS transistors $MP_3$ and $MP_4$ are connected to the drains of the NMOS transistors $MN_2$ and $MN_1$, respectively. The drains of the PMOS transistors $MP_3$ and $MP_4$ are further connected to the sources of the PMOS transistors $MP_5$ and $MP_6$, respectively. The gates of the PMOS transistors $MP_5$ and $MP_6$ are connected in common and these gates are supplied with a bias voltage $V_1$ in common. In order to allow use of the non-doped type NMOS transistors as the NMOS transistor pair 2, it is important to use a folded cascode type current mirror as the current mirror 4, as to be described later.

The current mirror 5 as well as the current mirror 4 are a folded cascode type current mirror and include the NMOS transistors $MN_3$ to $MN_6$. Specifically, the sources of the NMOS transistors $MN_3$ and $MN_4$ are connected to a ground line 8 which is supplied with a ground voltage $V_{SS}$, and the gates of the NMOS transistors $MN_3$ and $MN_4$ are connected in common to the drain of the NMOS transistors $MN_5$. The drains of the NMOS transistors $MN_3$ and $MN_4$ are connected to the drains of the PMOS transistors $MP_2$ and $MP_1$, respectively. The drains of the NMOS transistors $MN_3$ and $MN_4$ are further connected to the sources of the NMOS transistors $MN_5$ and $MN_6$, respectively. The gates of the NMOS transistors $MN_5$ and $MN_6$ are connected in common and these gates are supplied with a bias voltage $V_2$ in common. In the present embodiment, normal enhancement type NMOS transistors are used as the NMOS transistors $MN_3$ to $MN_6$.

The constant current source $I_{S3}$ is connected between the drains of the PMOS transistor $MP_5$ and the NMOS transistor $MN_5$, and the floating current source 6 is connected between the drains of the PMOS transistor $MP_6$ and the NMOS transistor $MN_6$. Herein, the floating current source 6 includes the PMOS transistor $MP_7$ and the NMOS transistor $MN_7$. The source of the PMOS transistor $MP_7$ and the drain of the NMOS transistor $MN_7$ are connected in common to the drain of the PMOS transistor $MP_6$. Meanwhile, a drain of the PMOS transistor $MP_7$ and a source of the NMOS transistor $MN_7$ are connected in common to the drain of the NMOS transistor $MN_6$. A bias voltage $V_3$ is supplied to the gate of the PMOS transistor $MP_7$, and a bias voltage $V_4$ is supplied to the gate of the NMOS transistor $MN_7$.

The PMOS transistor $MP_8$ and the NMOS transistor $MN_8$ act as output transistors for generating an output voltage $V_{OUT}$. Specifically, the source of the PMOS transistor $MP_8$ is connected to the power supply line 7 and the drain thereof is connected to an output terminal 11. Further, the source of the NMOS transistor $MN_8$ is connected to the ground line 8 and the drain thereof is connected to the output terminal 11. The gate of the PMOS transistor $MP_8$ is connected to the source of the PMOS transistor $MP_7$ and the drain of the NMOS transistor $MN_7$ (i.e., one terminal of the floating current source 6). Meanwhile, the gate of the NMOS transistor $MN_8$ is connected to the drain of the PMOS transistor $MP_7$ and the source of the NMOS transistor $MN_7$ (i.e., the other terminal of the floating current source 6).

The phase compensating capacitor $C_1$ is connected between the output terminal 11 and the drain of the PMOS transistor $MP_4$, and the phase compensating capacitor $C_2$ is connected between the output terminal 11 and the drain of the NMOS transistor $MN_4$.

In the circuit configuration of the present embodiment, an important point is in that the non-doped type NMOS transistor is used for the NMOS transistors $MN_1$ and $MN_2$ of the NMOS transistor pair 2. By using the non-doped type NMOS transistors as the NMOS transistors $MN_1$ and $MN_2$, it becomes possible to realize the amplitude difference deviation characteristic suited for the output stage of the data line driver for driving the data lines of the liquid crystal display panel. That is, by using the non-doped type NMOS transistors as the NMOS transistors $MN_1$ and $MN_2$, the amplitude difference deviation can be decreased to some degree even if the input voltages In$^+$ and In$^−$ are in the voltage range in the vicinity of the power supply voltage $V_{DD}$. Especially, when the input voltages are not in the voltage range in the vicinity of the power supply voltage $V_{DD}$, the amplitude difference deviation can be remarkably reduced. The technical significance of using the non-doped type NMOS transistors as the NMOS transistors $MN_1$ and $MN_2$ will be described in detail.

When the NMOS transistors $MN_1$ and $MN_2$ of the NMOS transistor pair 2 act as the depletion type transistors, the NMOS transistor pair 2 becomes operable even when the input voltages In$^+$ and In$^−$ are in the voltage range in the vicinity of the ground voltage $V_{SS}$ of 0V. Thus, switching of the circuit operation does not occur even when the input voltages In$^+$ and In$^−$ are in the voltage range in the vicinity of 0V. Whereas, in the conventional circuit configuration shown in FIG. 1, the NMOS transistor pair 102 does not operate when the input voltages In$^+$ and In$^−$ are in the voltage range in the vicinity of the ground voltage $V_{SS}$, and the PMOS transistor pair 103 does not operate when the input voltages In$^+$ and In$^−$ are in a voltage range in the vicinity of the power supply voltage $V_{DD}$. This causes the amplitude difference deviation to increase when the input voltages In$^+$ and In$^−$ are in the voltage range in the vicinity of the ground voltage $V_{SS}$ and when the input voltages In$^+$ and In$^−$ are in the voltage range in the vicinity of the power supply voltage $V_{DD}$. In contrast, in the present embodiment, since switching of the circuit operation does not occur even when the input voltages In$^+$ and In$^−$ are in the voltage range in the vicinity of the ground voltage $V_{SS}$, an increase of the amplitude difference deviation does not occur in this voltage range.

On the other hand, when the NMOS transistors $MN_1$ and $MN_2$ are non-doped type NMOS transistors, there is a fear of obstacle to the operation of the NMOS transistor pair 2 when the input voltages In⁺ and In⁻ to the NMOS transistor pair 2 are in the voltage range in the vicinity of the power supply voltage $V_{DD}$. That is, when the non-doped type NMOS transistors are used as the NMOS transistors $MN_1$ and $MN_2$, source potentials of the NMOS transistors $MN_1$ and $MN_2$ are increased higher compared to the case of using normal enhancement type NMOS transistors, and through this increase, the drain potentials of the NMOS transistors $MN_1$ and $MN_2$ must be made higher. Therefore, an active load connected to the NMOS transistor pair 2 must be adapted to allow a sufficiently high bias voltage to be supplied to the NMOS transistors $MN_1$ and $MN_2$ of the NMOS transistor pair 2 even when the input voltages In⁺ and In⁻ are in the voltage range in the vicinity of the power supply voltage $V_{DD}$.

In order to deal with this problem, in the present embodiment, a folded cascode type current mirror is used as the current mirror 4. Since a bias voltage to be supplied to the gates of the PMOS transistors $MP_3$ and $MP_4$ is generated by the PMOS transistor $MP_5$, and the NMOS transistors $MN_1$ and $MN_2$ of the NMOS transistor pair 2 are connected to the drains of the PMOS transistors $MP_4$ and $MP_3$, the drain voltages of the NMOS transistors $MN_1$ and $MN_2$ can be set almost close to the power supply voltage $V_{DD}$. It should be noted that, in the case of a configuration like a normal current mirror in which the drain of the PMOS transistor $MP_3$ is connected to the gate, the drain voltage of the NMOS transistor pair 2 is made lower than the power supply voltage $V_{DD}$ by a threshold voltage $V_{TP}$ of the PMOS transistor $MP_3$. As a result of this, the NMOS transistor pair 2 becomes difficult to operate in the voltage range in the vicinity of the power supply voltage $V_{DD}$. In the present embodiment, since a folded cascode type current mirror is used as the current mirror 4, the NMOS transistor pair 2 including the non-doped type NMOS transistors can be made operable in the whole voltage range from the ground voltage $V_{SS}$ to the power supply voltage $V_{DD}$.

Figure 2:
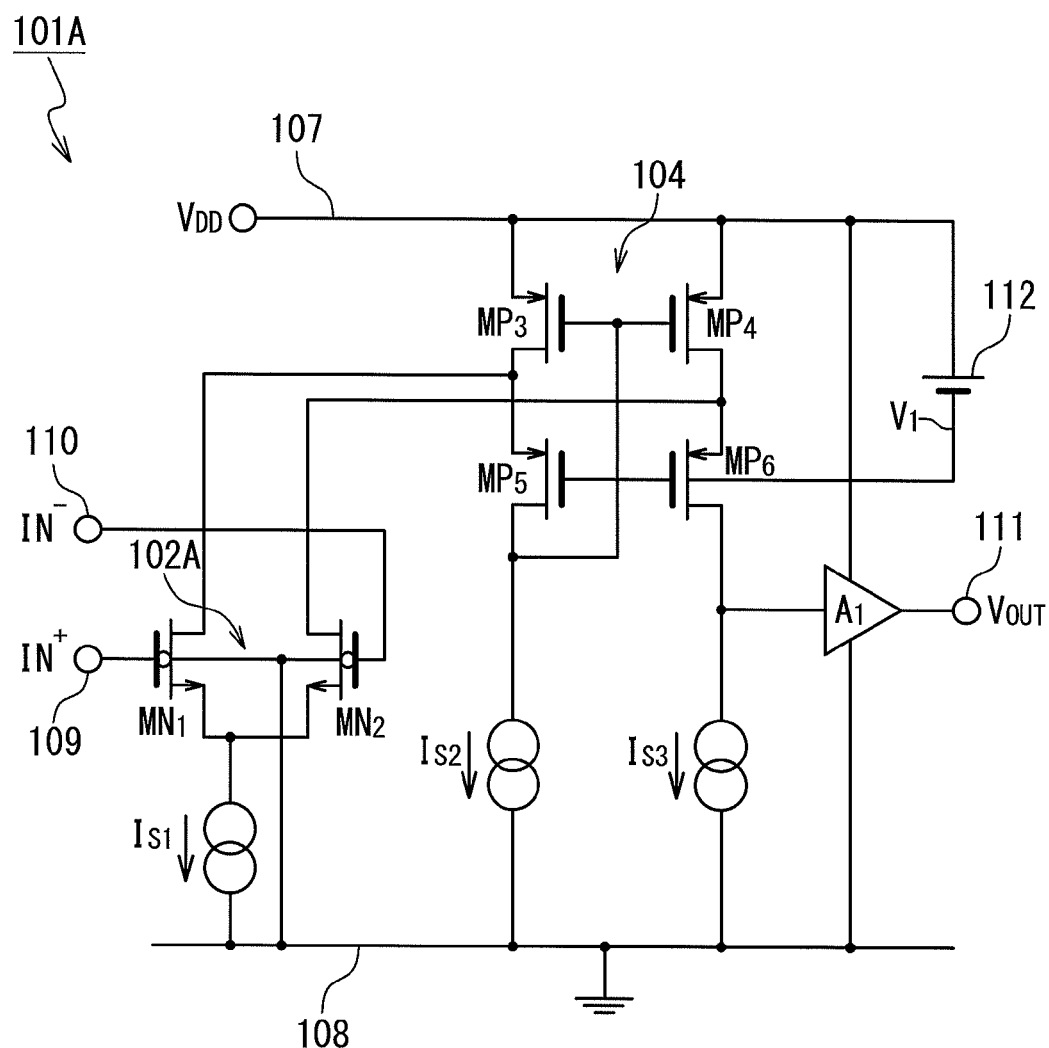
FIG. 2 is a circuit diagram showing another example of the configuration of another conventional differential amplifier circuit.
Figure 3:
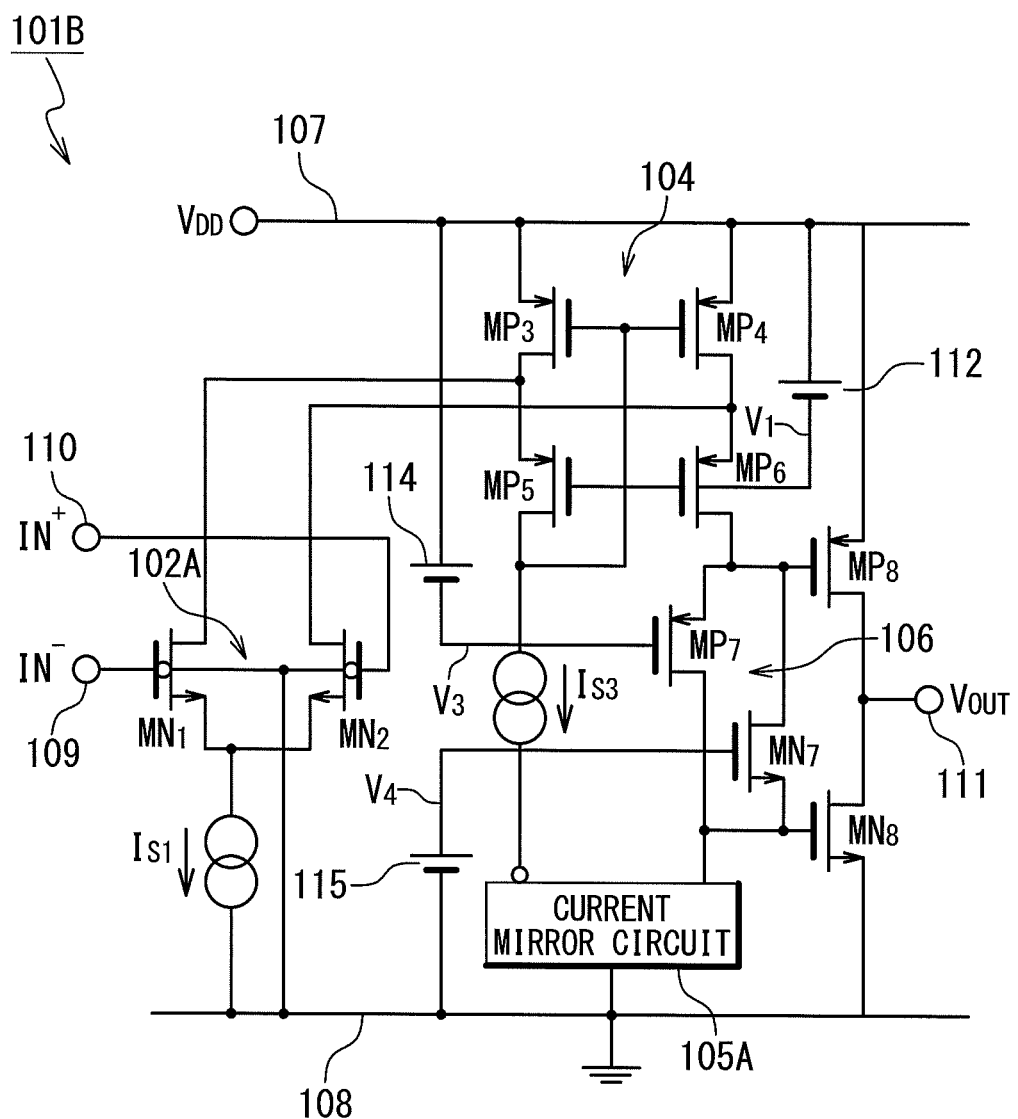
FIG. 3 is a circuit diagram showing further another example of the configuration of another conventional differential amplifier circuit.
Figure 4:
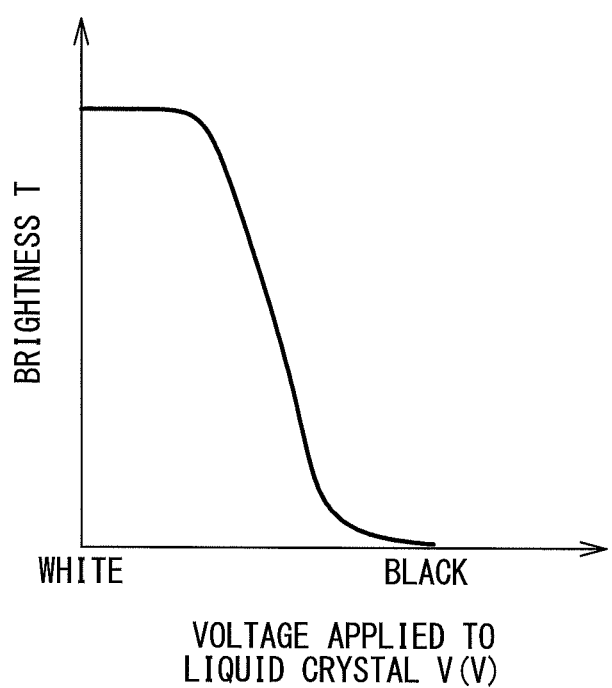
FIG. 4 is a graph showing a relation between a voltage applied to a liquid crystal of a pixel of a liquid crystal display panel and a luminance of the pixel.

Regarding the conventional NMOS transistor pair 102A including the non-doped type NMOS transistors as shown in FIGS. 2 and 3, since switching of the circuit operation does not occur, it may be considered that the amplitude difference deviation characteristics are still more favorable. However, in the configurations shown in FIGS. 2 and 3, there is a problem that the amplitude difference deviation cannot be sufficiently reduced in the intermediate voltage range. This is because the mutual conductance gm in an input stage is small in the intermediate voltage range in the configurations shown in FIGS. 2 and 3.

Initially, a relation between the mutual conductance in the input stage and the amplitude difference deviation will be described. In a differential amplifier circuit, as a mutual conductance of the MOS transistor in the input stage is larger, an offset of the differential amplifier circuit becomes smaller, and therefore the amplitude difference deviation becomes small as the whole driver for driving the liquid crystal display panel. For example, in the differential amplifier circuit shown in FIG. 7A, an offset voltage $V_{OS}$ of the differential amplifier circuit is represented by the following equation (1):

$$V_{OS} = \Delta V_{T(M1,M2)} + \Delta V_{T(M3,M4)} \frac{g_{m(M3,4)}}{g_{m(M1,2)}} + \frac{V_{GS(M1,M2)} - V_{T(M1,M2)}}{2} \left\{ \frac{-\Delta(W/L)_{(M1,M2)}}{(W/L)_{(M1,M2)}} - \frac{-\Delta(W/L)_{(M3,M4)}}{(W/L)_{(M3,M4)}} \right\}. \quad (1)$$

In the equation (1), $\Delta V_{T(M1,M2)}$ is a relative error of threshold voltages of differential transistors M1 and M2, and $\Delta V_{T(M3,M4)}$ is a relative error of threshold voltages of active load transistors M3 and M4. $gm_{(M1,2)}$ is a mutual conductance of the differential transistors M1 and M2, and $gm_{(M3,4)}$ is a mutual conductance of the active load transistors M3 and M4. $V_{GS(M1,M2)}$ is a voltage between the source and the gate of the differential transistors M1 and M2, and $V_{T(M1,M2)}$ is a design value of a threshold voltage of the differential transistors M1 and M2. $(W/L)_{(M1,M2)}$ is a design value of a W/L ratio of the differential transistors M1 and M2, and $\Delta(W/L)_{(M1,M2)}$ is a (relative) error from the design value of the W/L ratio of the differential transistors M1 and M2. Finally, $(W/L)_{(M3,M4)}$ is a design value of a W/L ratio of the active load transistors M3 and M4, and $\Delta(W/L)_{(M3,M4)}$ is a (relative) error from the design value of the W/L ratio of the active load transistors M3 and M4.

Figure 7A:
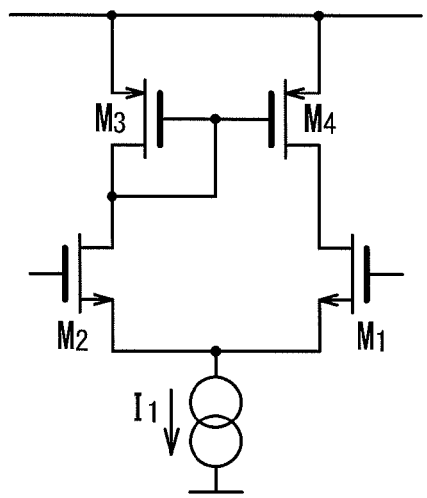
FIG. 7A is a circuit diagram showing a configuration of a typical differential amplifier circuit.

As understood from the equation (1), in the differential amplifier circuit shown in FIG. 7A, as the mutual conductance $gm_{(M1,2)}$ of the differential transistors in the input stage becomes larger, the offset voltage $V_{OS}$ becomes smaller. As in the differential amplifier circuit 1 of the present embodiment, even if the configuration of the active load is different, the tendency thereof is the same.

Figure 1:
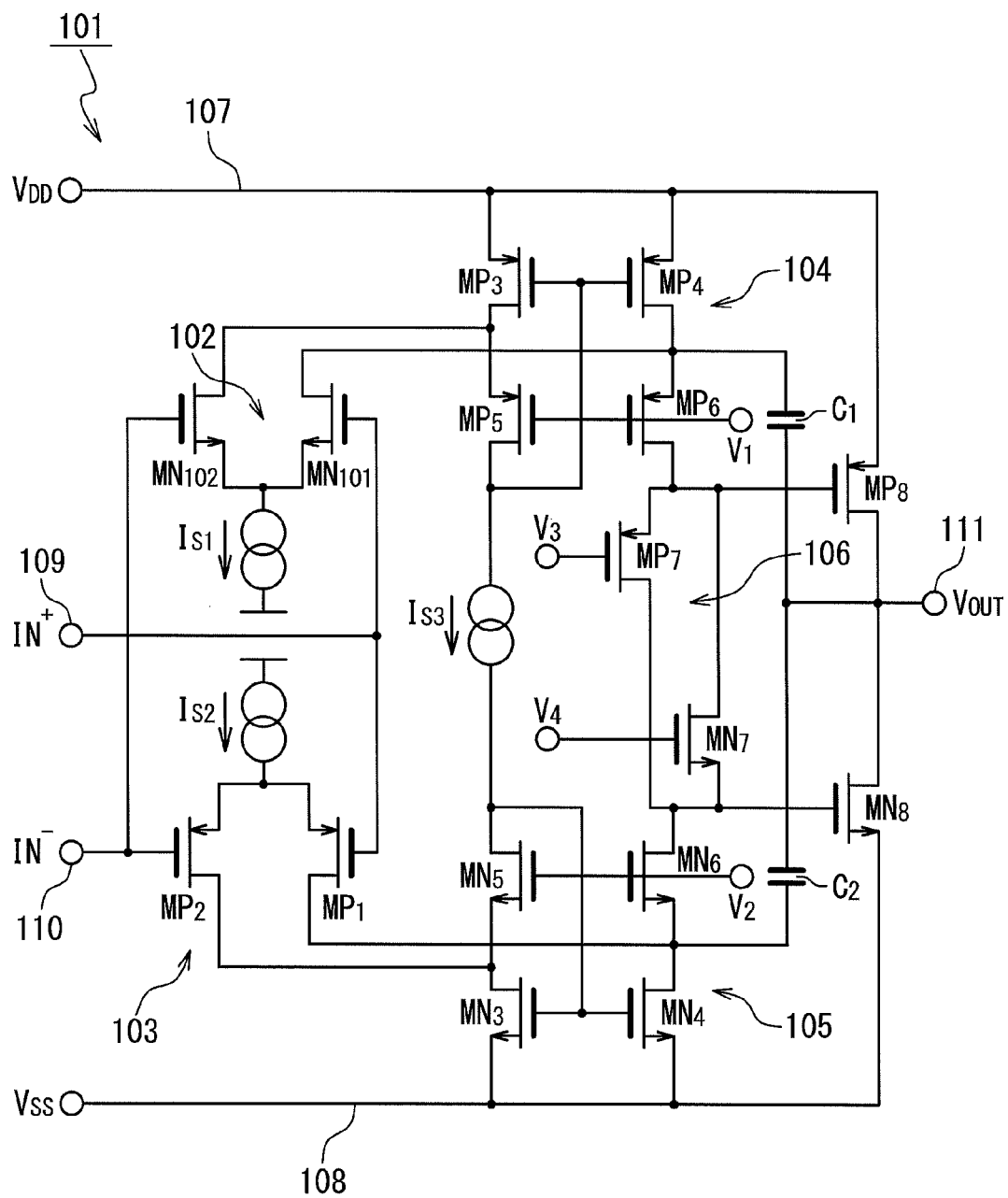
FIG. 1 is a circuit diagram showing an example of a configuration of a conventional differential amplifier circuit.
Figure 7B:
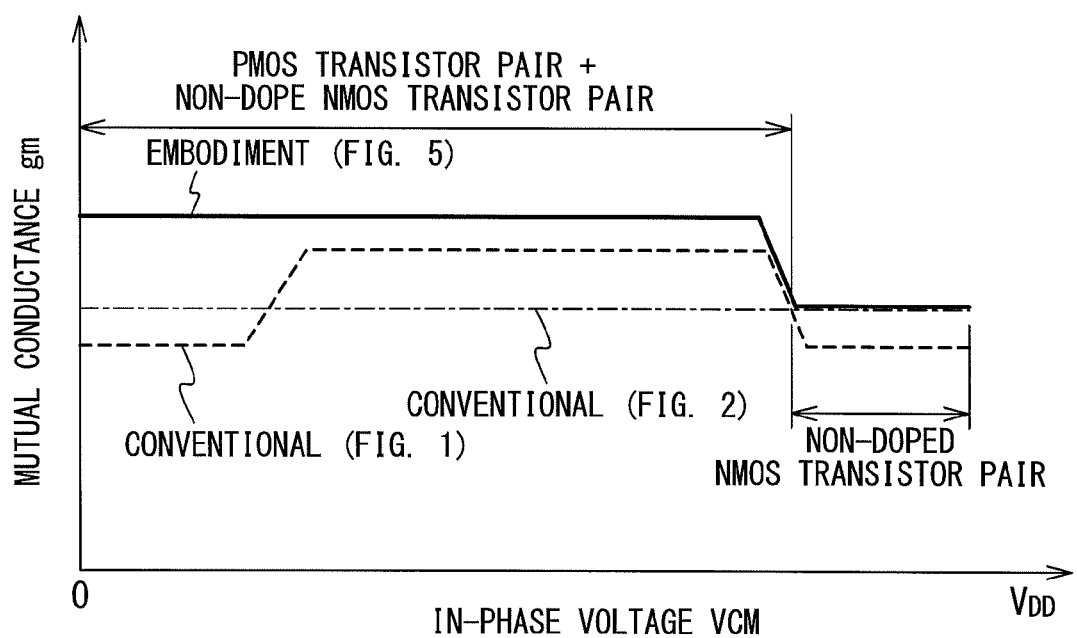
FIG. 7B is a graph showing a mutual conductance in an input stage of the differential amplifier circuits in FIGS. 1, 2 and 5.

FIG. 7B is a conception diagram showing mutual conductances in the input stages of the conventional differential amplifier circuits shown in FIGS. 1 and 2 and of the differential amplifier circuit of the present embodiment. In the graph in FIG. 7B, there are two factors that affect the mutual conductance in the input stage. First, the mutual conductance increases when both the NMOS transistor pair and the PMOS transistor pair operate. Herein, it should be noted that when the NMOS transistor pair and the PMOS transistor pair are both in operation, the mutual conductance in the input stage is a summation of the mutual conductance of the NMOS transistor pair and the mutual conductance of the PMOS transistor pair. Second, the mutual conductance of the non-doped type NMOS transistor is larger than the mutual conductance of the normal enhancement type NMOS transistor.

First of all, in the conventional differential amplifier circuit shown in FIG. 1, since both of the NMOS transistor pair 102 and the PMOS transistor pair 103 operate in the intermediate voltage range, a large mutual conductance gm is obtained. However, when the same phase voltage VCM (mean value of the input voltages In⁺ and In⁻) is in the voltage range in the vicinity of the ground voltage $V_{SS}$ of 0V and when the same phase voltage VCM is in the voltage range in the vicinity of the power supply voltage $V_{DD}$, the mutual conductance in the input stage becomes small.

Also, in the differential amplifier circuit shown in FIG. 2, since the mutual conductance of the non-doped type NMOS transistor is large, a mutual conductance in the input stage larger than that in the differential amplifier circuit shown in FIG. 1 can be obtained when the same phase voltage VCM is in the voltage range in the vicinity of 0V and when the same phase voltage VCM is in the voltage range in the vicinity of the power supply voltage $V_{DD}$. However, a sufficiently large mutual conductance cannot be obtained in the intermediate voltage range. This means that the offset of the differential amplifier circuit increases in the intermediate voltage range, namely, the amplitude difference deviation cannot be sufficiently reduced. As described before, since it is strongly required to reduce the amplitude difference deviation in the intermediate voltage range, the configuration of the differential amplifier circuit shown in FIG. 2 which cannot reduce the amplitude difference deviation in the intermediate voltage range is improper for a liquid crystal display panel.

On the other hand, in the differential amplifier circuit 1 according to the present embodiment, a large mutual conductance gm in the input stage can be obtained when the same phase voltage VCM is in the voltage range in the vicinity of 0V and when the same phase voltage VCM is in the intermediate voltage range. This is because the NMOS transistor pair and the PMOS transistor pair are both in operation and the non-doped type NMOS transistors are used as the NMOS transistor pair. Also, when the same phase voltage VCM is near the power supply voltage $V_{DD}$, a mutual conductance substantially equal to that in the differential amplifier circuit in FIG. 2 can be obtained. Thus, in the differential amplifier circuit 1 of the present embodiment, there can be obtained a mutual conductance in the input stage equal to or larger than the conventional differential amplifier circuit. This is effective for reducing the amplitude difference deviation.

Figure 8A:
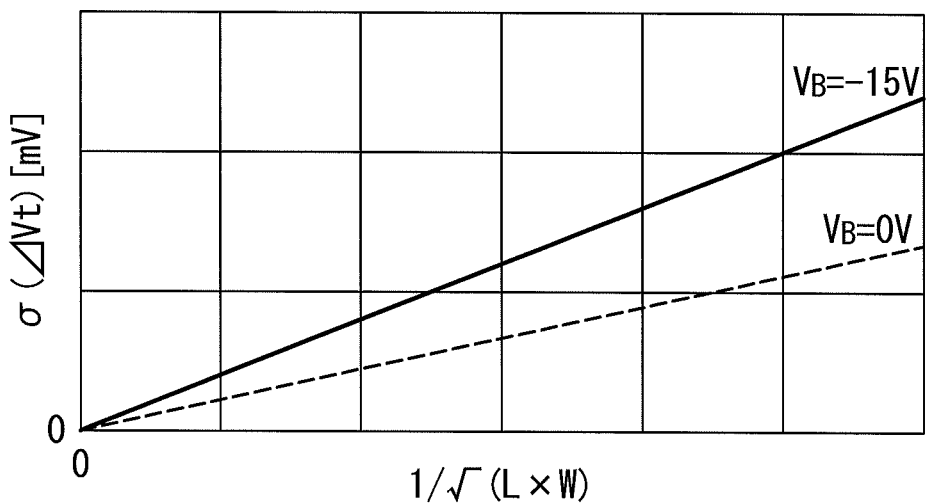
FIGS. 8A and 8B are diagrams showing Pelgrom plots of a normal enhancement type NMOS transistor and a non-doped type NMOS transistor.
Figure 8B:
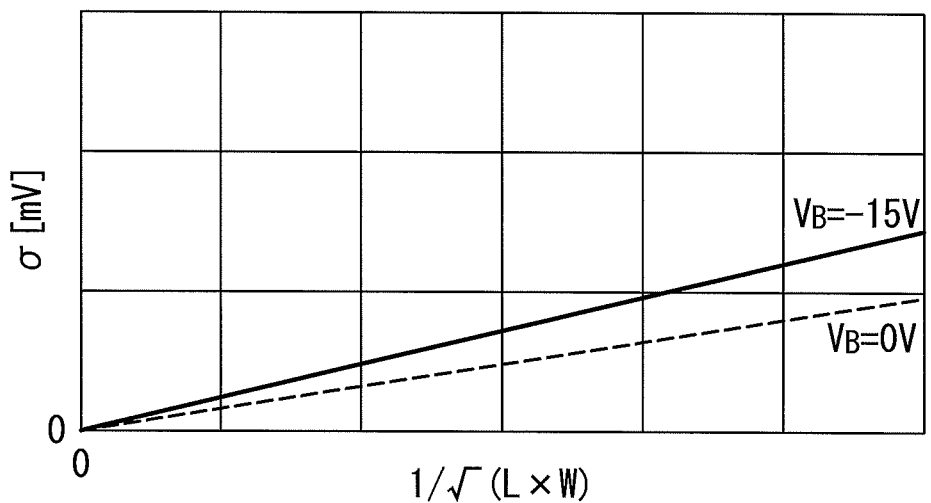

The use of the non-doped type NMOS transistor as the NMOS transistors $MN_1$ and $MN_2$ of the NMOS transistor pair 2 is also effective to reduce a relative error of the threshold voltages between the NMOS transistors $MN_1$ and $MN_2$ in the input stage. This can be comprehended in view of the Pelgrom plots shown in FIGS. 8A and 8B. FIG. 8A shows Pelgrom plots of a normal enhancement type NMOS transistor, and FIG. 8B shows Pelgrom plots of a non-doped type NMOS transistor. The graphs in FIGS. 8A and 8B are obtained through a simulation using a Monte Carlo method. In the Pelgrom plots, a horizontal axis is $1/(L \times W)^{1/2}$ (L is a gate length of a NMOS transistor and W is a gate width), and a vertical axis is a standard deviation.

The standard deviation of the threshold voltage of the NMOS transistor depends on the gate length and the gate width and also depends on a back-gate voltage $V_B$. In general, when a back-gate voltage $V_B$ becomes lower than 0V, the standard deviation of the threshold voltage also increases, i.e., the inclination of the Pelgrom plots increases.

Herein, it should be noted that when the input voltages $In^+$ and $In^-$ are near the power supply voltage $V_{DD}$, the back-gate voltage $V_B$ is lower than 0V and therefore the inclination of the Pelgrom plots increases. One of the reasons why the amplitude difference deviation increases when the input voltages $In^+$ and $In^-$ are near the power supply voltage $V_{DD}$, is that the variation of the threshold voltages of the NMOS transistors increases when the back-gate voltage $V_B$ is lower than 0V.

Herein, in the non-doped type NMOS transistors without formation of a P-well and channel implantation, the number of steps is less so that the variation is small, and therefore the inclination of the Pelgrom plots is moderate. Especially, in the non-doped type NMOS transistor, when the back-gate voltage $V_B$ is lower than 0V (for example, when the back-gate voltage $V_B$ is −15V), the inclination of the Pelgrom plots is suppressed. This means that the amplitude difference deviation can be suppressed in the voltage range in the vicinity of the power supply voltage $V_{DD}$ by using the non-doped type NMOS transistors as the NMOS transistors $MN_1$ and $MN_2$.

As described above, in the differential amplifier circuit 1 of the present embodiment, since the non-doped type NMOS transistors are used as the NMOS transistors $MN_1$ and $MN_2$ of the NMOS transistor pair 2, the relative error of the threshold voltages of the NMOS transistors $MN_1$ and $MN_2$ can be made small to reduce the amplitude difference deviation.

Herein, in the circuit configuration using both of the NMOS transistor pair 2 and the PMOS transistor pair 3 as the differential amplifier circuit 1 of the present embodiment, it should be noted that the use of the non-doped type NMOS transistors as the NMOS transistors $MN_1$ and $MN_2$ of the NMOS transistor pair 2 is not essential to realize the Rail-to-Rail operation. That is, even if the NMOS transistors $MN_1$ and $MN_2$ of the NMOS transistor pair 2 are the normal enhancement type NMOS transistors, the Rail-to-Rail operation can be realized. Rather, it is necessary to use the folded cascode type current mirror 4 from the viewpoint of the Rail-to-Rail operation because of the use of the non-doped type NMOS transistors as the NMOS transistors $MN_1$ and $MN_2$ of the NMOS transistor pair 2.

In spite of this, the non-doped type NMOS transistors are used as the NMOS transistors $MN_1$ and $MN_2$ of the NMOS transistor pair 2 in the differential amplifier circuit 1 of the present embodiment. This is because an excellent amplitude difference deviation characteristic suited for the liquid crystal characteristic can be obtained. An appropriate amplitude difference deviation characteristic suited for the liquid crystal characteristic is such a characteristic that the amplitude difference deviation is small to some degree in the whole voltage range, especially small in the intermediate voltage range as described above. In the differential amplifier circuit 1 of the present embodiment, the non-doped type NMOS transistors are used as the NMOS transistors $MN_1$ and $MN_2$ of the NMOS transistor pair 2 in the configuration using the NMOS transistor pair 2 and the PMOS transistor pair 3. Therefore, switching of the circuit operation (i.e., switching of use/unused of the NMOS transistor pair 2 and the PMOS transistor pair 3) is caused only in the voltage range in the vicinity of the power supply voltage $V_{DD}$. Moreover, the mutual conductance in the input stage can be increased in the whole voltage range. In addition, a relative error of the threshold voltages of the NMOS transistors $MN_1$ and $MN_2$ due to the variations in production can be suppressed. Therefore, in the differential amplifier circuit 1 of the present embodiment, an excellent amplitude difference deviation characteristic suited for the liquid crystal characteristic can be obtained.

Figure 9A:
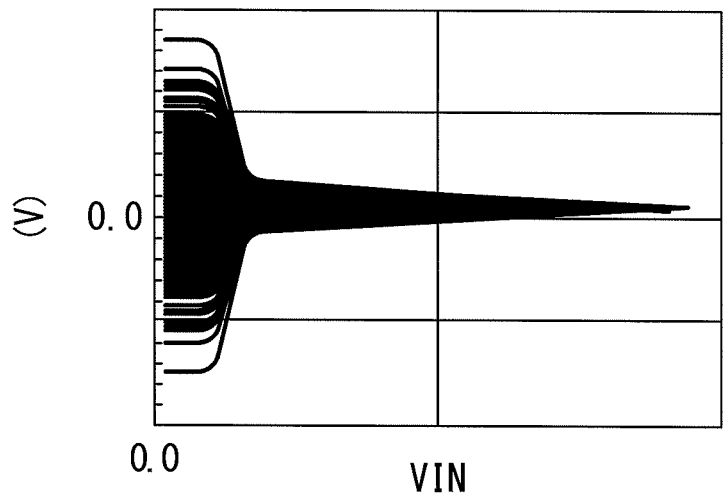
FIGS. 9A and 9B are graphs showing amplitude difference deviation characteristics of the differential amplifier circuits shown in FIGS. 1 and 5.
Figure 9B:
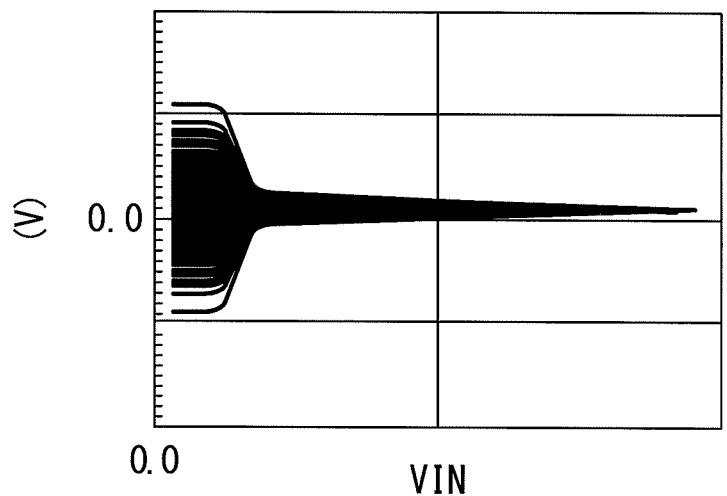

FIGS. 9A and 9B are graphs showing simulation results of the amplitude difference deviations of the conventional differential amplifier circuit shown in FIG. 1 and the differential amplifier circuit 1 of the present embodiment. Specifically, FIG. 9A denotes an offset voltage curve of each differential amplifier circuit when a plurality of differential amplifier circuits shown in FIG. 1 are produced, and FIG. 9B denotes an offset voltage curve of each differential amplifier circuit when a plurality of differential amplifier circuits of the present embodiment are produced. In FIGS. 9A and 9B, however, it should be noted that the horizontal axis VIN represents an absolute voltage value of positive and negative voltage from each power supply voltage ($V_{DD}$, $V_{SS}$), and the voltage ranges in the vicinity of 0.0V in FIGS. 9A and 9B actually show voltage characteristics in the vicinity of the power supply voltage ($V_{DD}$, $V_{SS}$). In the differential amplifier circuit 1 of the present embodiment compared to the conventional differential amplifier circuit 1 shown in FIG. 1, it could be understood from the graphs shown in FIGS. 9A and 9B that the amplitude difference deviation can be reduced in the whole voltage range.

Figure 10:
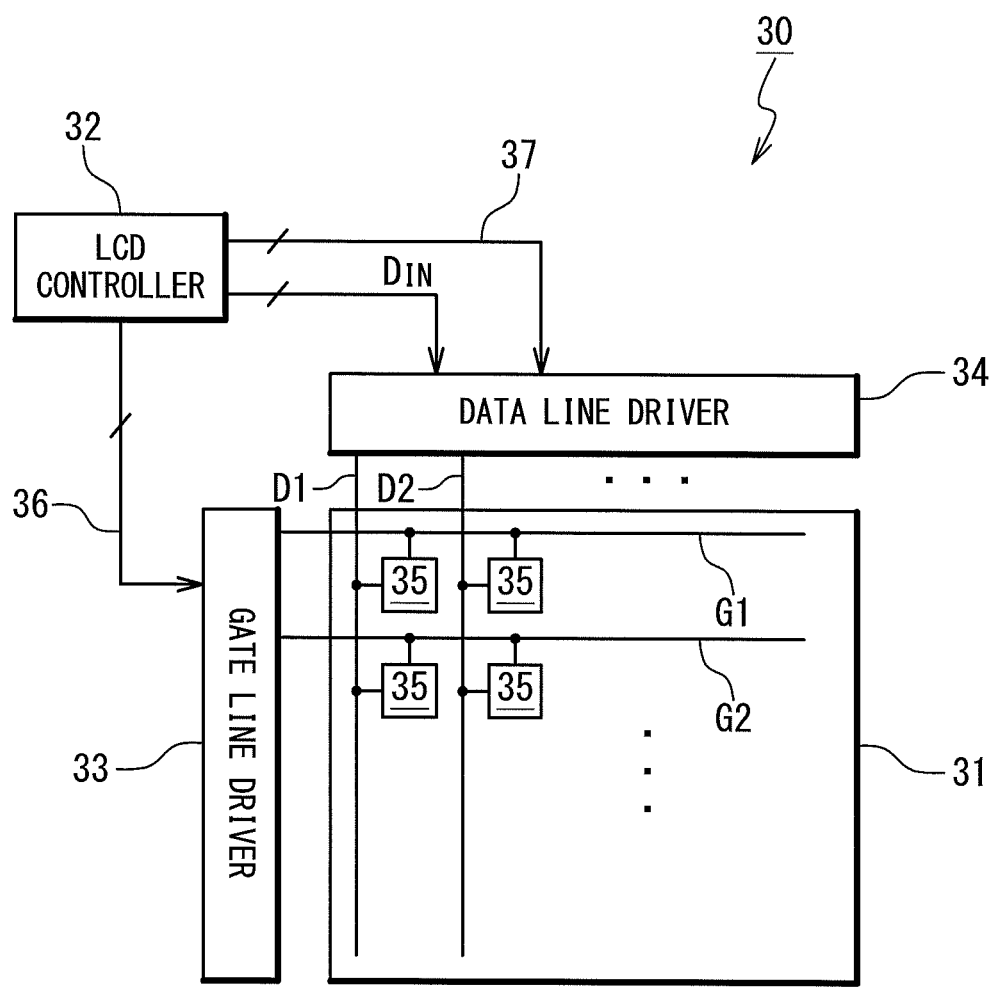
FIG. 10 is a block diagram showing an example of a configuration of a liquid crystal display apparatus applied with the differential amplifier circuit of the present invention.
Figure 11:
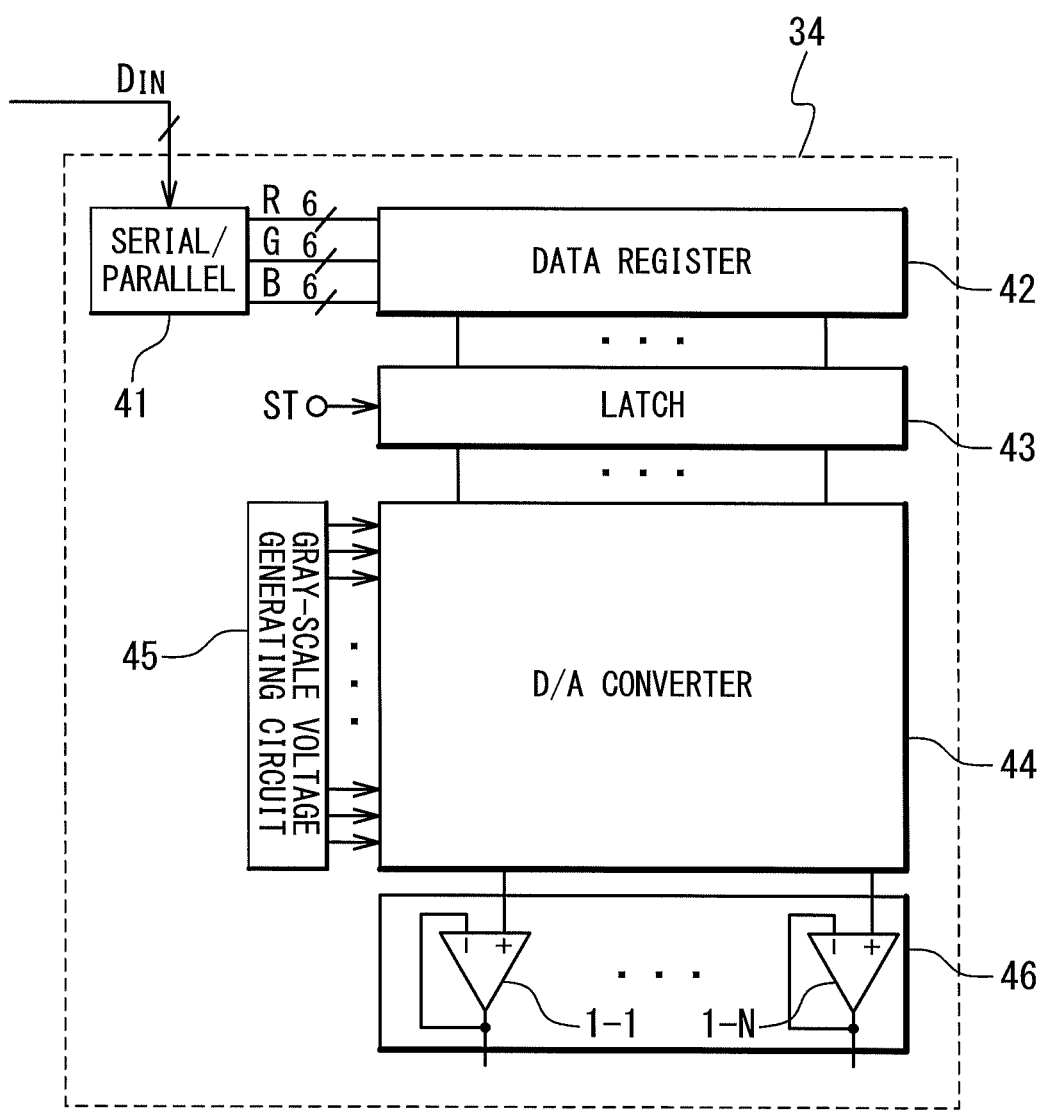
FIG. 11 is a block diagram showing an example of a configuration of a data line driver applied with the differential amplifier circuit of the present invention.

The differential amplifier circuit 1 of the present embodiment is appropriately used in the output stage of the data line driver for driving the data lines of the liquid crystal panel. FIG. 10 is a block diagram showing an appropriate configurational example of a liquid crystal display apparatus, and FIG. 11 is a block diagram showing an appropriate configurational example of the data line driver. The liquid crystal display apparatus 30 in FIG. 10 includes a liquid crystal panel 31, an LCD controller 32, a gate line driver 33 and a data line driver 34. The liquid crystal display panel 31 is provided with data lines D1, D2, . . . , gate lines G1, G2, . . . and pixels 35 disposed at the intersecting points thereof. The LCD controller 32 supplies a gate line control signal 36 to the gate line driver 33, and supplies display data $D_{IN}$ and a data line control signal 37 to the data line driver 34. The display data $D_{IN}$ is data for showing a gray scale of each pixel 35 of the liquid crystal panel 31. The gate line driver 33 drives the gate lines G1, G2, . . . of the liquid crystal display panel 31 in response to the gate line control signal 36. Meanwhile, the data line driver 34 drives the data lines D1, D2, . . . of the liquid crystal panel 31 in response to the display data $D_{IN}$ and the data line control signal 37.

In the present embodiment, as shown in FIG. 11, the data line driver 34 includes a serial parallel converter 41, a data register 42, a latch circuit 43, a D/A converter 44, a gray scale voltage generating circuit 45 and an output stage 46. The serial/parallel converter circuit performs a serial-parallel conversion of the display data $D_{IN}$ serially transferred. The data register 42 sequentially receives the display data $D_{IN}$ subjected to the serial-parallel conversion and stores the received data. In response to a latch signal ST, the latch circuit 43 latches the display data corresponding to the pixels 35 for one line (i.e., pixels connected to one gate line Gi) from the data register 42. The D/A converter 44 performs digital/analog (D/A) conversion of the display data received from the latch circuit 43 and generates a gray scale voltage corresponding to the gray scale represented by each of the display data. The D/A converter 44 receives a plurality of gray scale voltages supplied from the gray scale voltage generating circuit 45 and selects any one of the plurality of gray scale voltages based on each display data. Thus, the digital/analog conversion is performed. The output stage 46 is provided with voltage followers, which drive the data lines D1, D2, . . . to the voltages corresponding to the gray scale voltages received from the D/A converter 44. The voltage follower included in the output stage 46 includes the differential amplifier circuit as shown in FIG. 5. In FIG. 11, the differential amplifier circuit 1 connected to the data lines Di is referenced by a symbol 1–i (i is an integer from 1 to N).

It should be noted that the configuration of the differential amplifier circuit of the present invention can be variously modified within a technical scope of the present invention. Especially, the configuration of the active load circuits connected to the NMOS transistor pair 2 and the PMOS transistor pair 3 can be variously modified under a condition that the folded cascode type current mirror 4 is connected to the NMOS transistor pair 2.

Figure 12A:
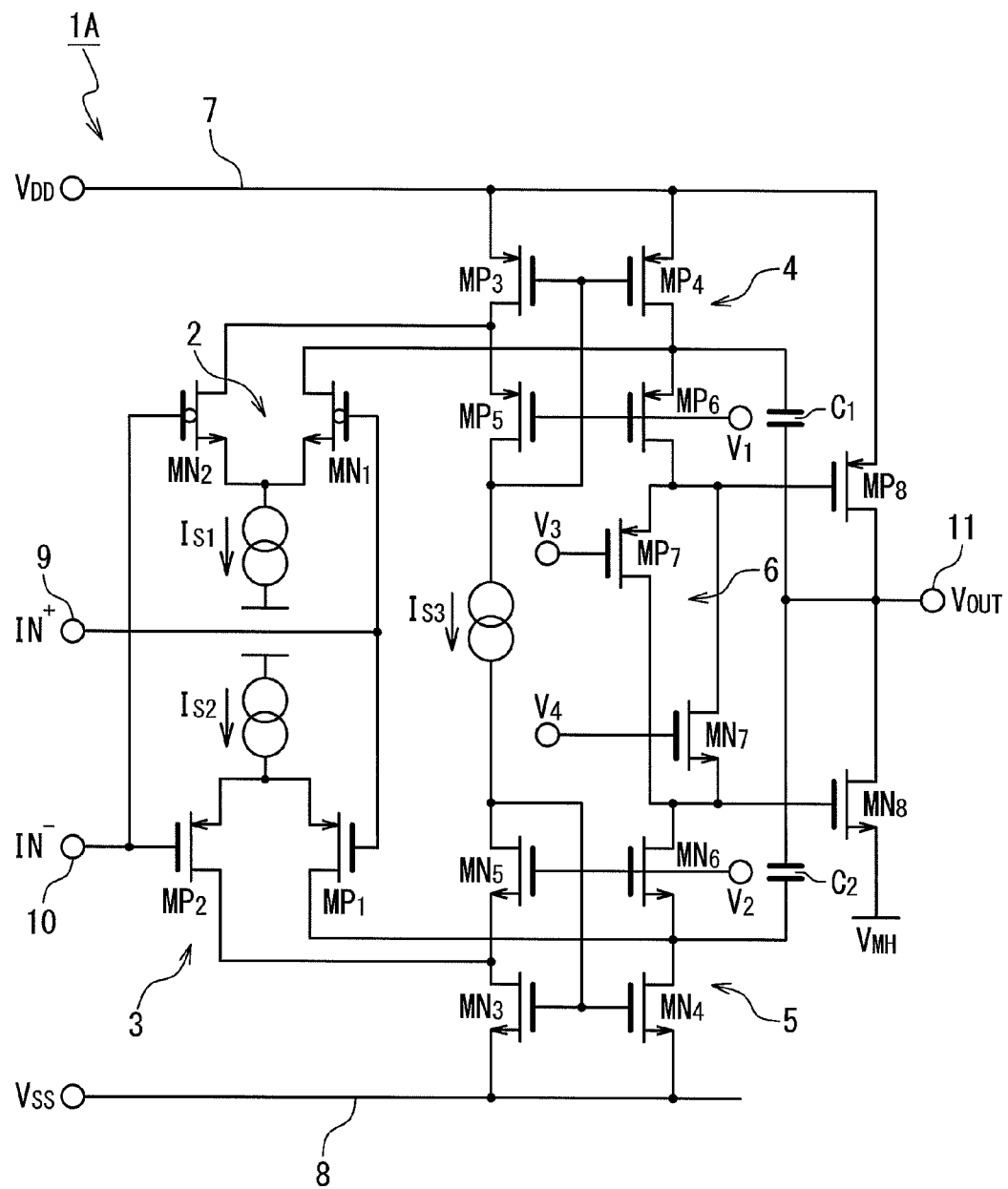
FIG. 12A is a circuit diagram showing the differential amplifier circuit of another embodiment of the present invention.
Figure 12B:
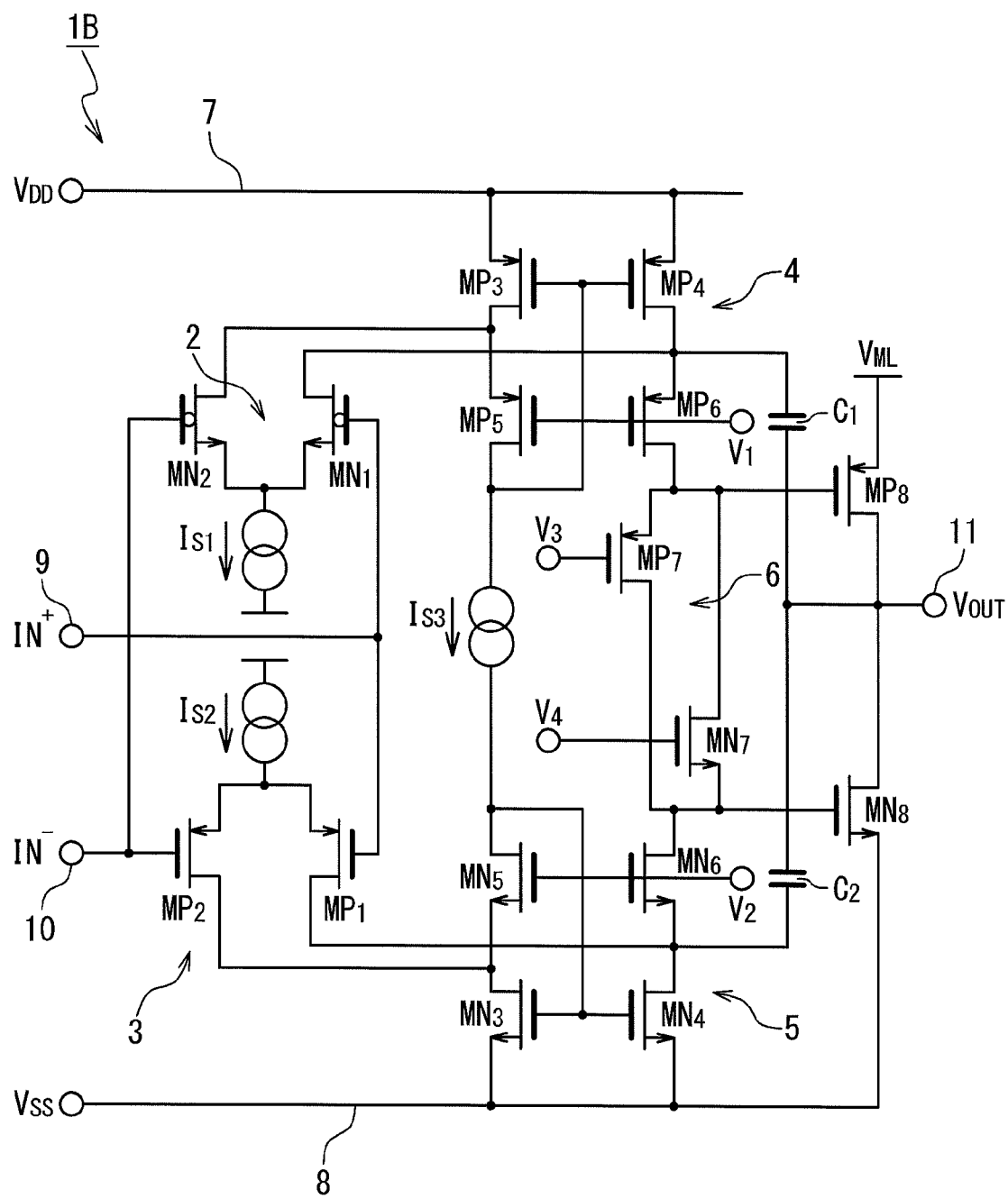
FIG. 12B is a circuit diagram showing the differential amplifier circuit of further another embodiment of the present invention.

FIGS. 12A and 12B are circuit diagrams showing configurations of differential amplifier circuits 1A and 1B according to other embodiments of the present invention, respectively. FIG. 12A is a circuit diagram showing a configuration of the differential amplifier circuit 1A to generate a voltage equal to or higher than an intermediate power supply voltage $V_{MH}$ and equal to or lower than the power supply voltage $V_{DD}$. Herein, the intermediate power supply voltage $V_{MH}$ is a voltage between the ground voltage $V_{SS}$ and the power supply voltage $V_{DD}$ and is typically adjusted to a voltage of $(V_{DD}-V_{SS})/2$. In the differential amplifier circuit 1A shown in FIG. 12A, the source of the NMOS transistor $MN_8$ acting as an output transistor is connected to a power supply line supplied with the intermediate power supply voltage $V_{MH}$. The other configuration is the same as the differential amplifier circuit 1 shown in FIG. 5.

On the other hand, FIG. 12B is a circuit diagram showing a configuration of the differential amplifier circuit 1B to generate a voltage equal to or higher than the ground voltage $V_{SS}$ and equal to or lower than the intermediate power supply voltage $V_{ML}$. Herein, the intermediate power supply voltage $V_{ML}$ is a voltage between the ground voltage $V_{SS}$ and the power supply voltage $V_{DD}$ and is typically adjusted to a voltage of $(V_{DD}-V_{SS})/2$. In the differential amplifier circuit 1B shown in FIG. 12B, the source of the PMOS transistor $MP_8$ acting as an output transistor is connected to a power supply line supplied with the intermediate power supply voltage $V_{ML}$.

In the configurations shown in FIGS. 12A and 12B, in order to reduce the power supply voltage $V_{DD}$, it is preferable to use a non-doped type transistor as the NMOS transistor $MN_7$ of the floating current source 6. By using the non-doped type transistor as the NMOS transistor $MN_7$ of the floating current source 6, a lower limit value of the voltage supplied to both terminals of the floating current source 6 can be reduced so that the power supply voltage $V_{DD}$ can be reduced.

Figure 13:
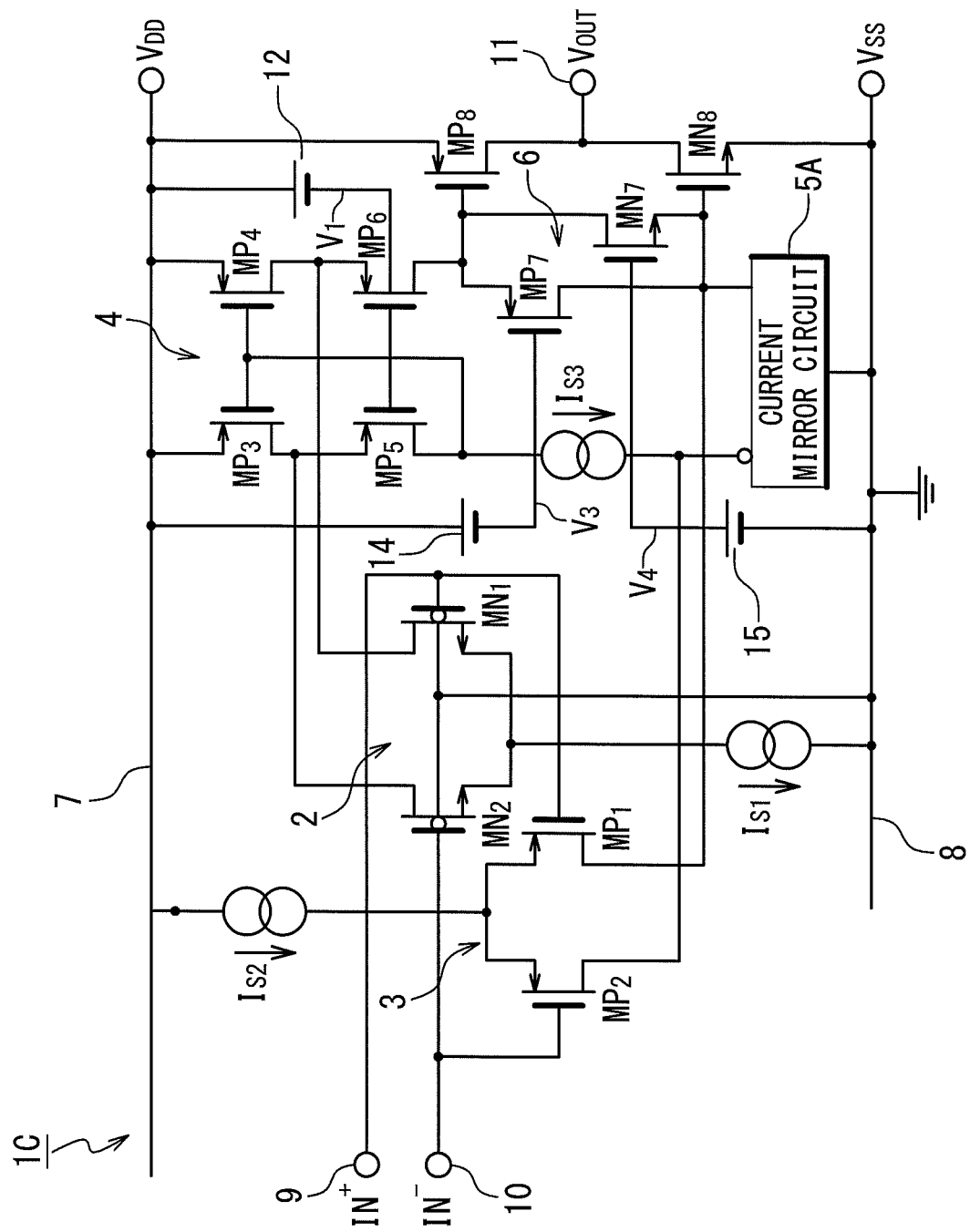
FIG. 13 is a circuit diagram showing the differential amplifier circuit of further another embodiment of the present invention.

FIG. 13 is a circuit diagram showing a configuration of a differential amplifier circuit 1C according to further another embodiment of the present invention. In this configuration, it is not always necessary that a current mirror connected to the PMOS transistor pair 3 is a folded cascode type current mirror. In FIG. 13, the current mirror connected to the PMOS transistor pair 3 is designated by a reference numeral 5A, which may be same as that of FIG. 5. Bias voltages $V_1$ to $V_4$ are generated by voltage sources 12 to 15, respectively. The other configuration is the same as those of the differential amplifier circuit 1 shown in FIG. 5.

Figure 14:
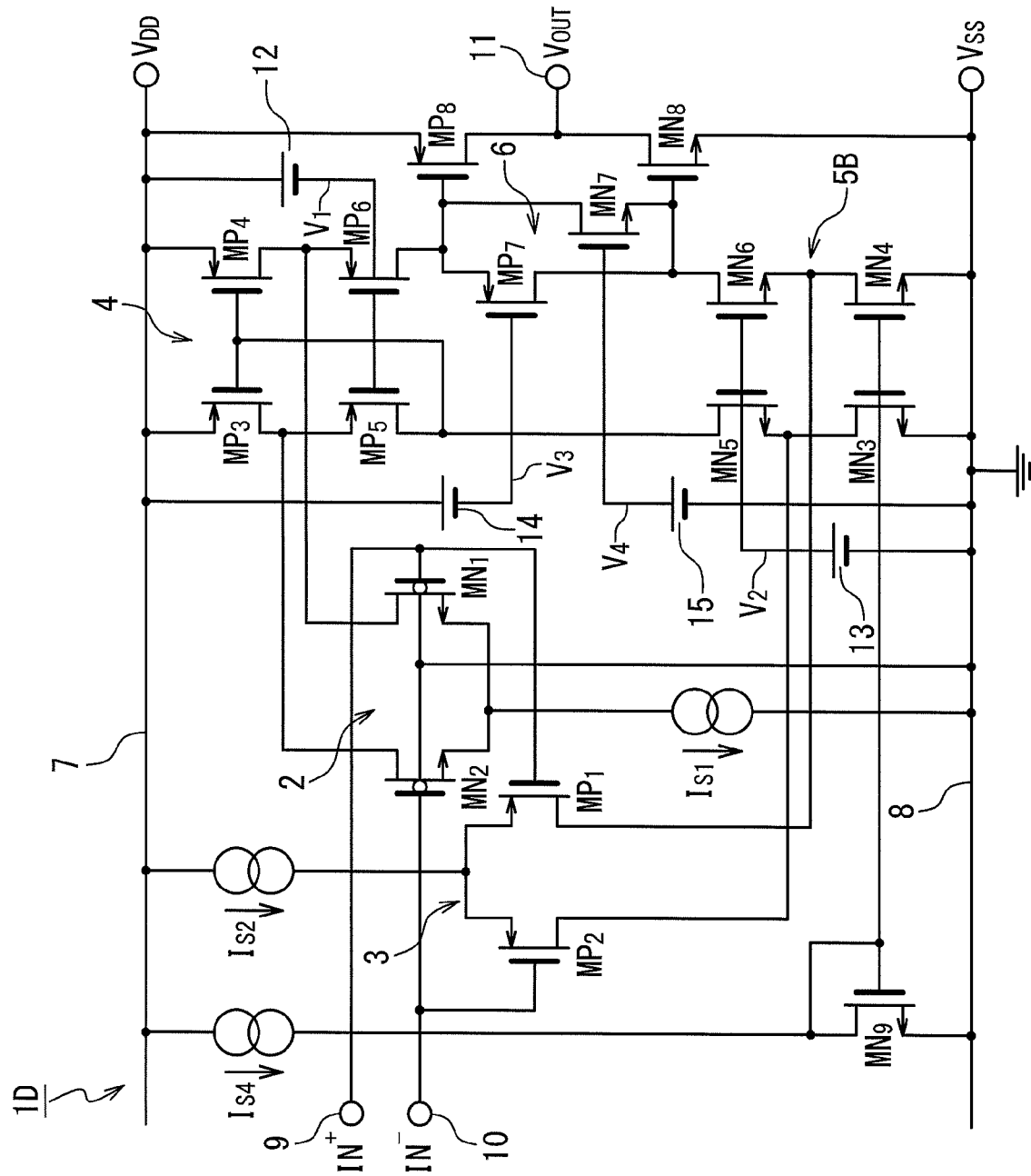
FIG. 14 is a circuit diagram showing the differential amplifier circuit of further another embodiment of the present invention.

FIG. 14 is a circuit diagram showing a configuration of a differential amplifier circuit 1D according to further another embodiment of the present invention. In the differential amplifier circuit 1D in FIG. 14, a current mirror 5B is connected to the PMOS transistor pair 3. The current mirror 5B includes the NMOS transistors $MN_3$ to $MN_6$. The sources of the NMOS transistors $MN_3$ and $MN_4$ are connected to the ground line 8 and the drains thereof are connected to the sources of the NMOS transistors $MN_5$ and $MN_6$, respectively. The gates of the NMOS transistors $MN_5$ and $MN_6$ are supplied with the bias voltage $V_2$, and the drain of the NMOS transistor $MN_5$ is directly connected to the drain of the PMOS transistor $MP_5$ of the current mirror 4, and the drain of the NMOS transistor $MN_6$ is connected in common to the drain and the source of the NMOS transistor $MN_7$ of the PMOS transistor $MP_7$ of the floating current source 6. It should be noted that there is not provided a constant current source $I_{S3}$ between the drain of the NMOS transistor $MN_5$ and the drain of the PMOS transistor $MP_5$ in this configuration, unlike the differential amplifier circuit 1 shown in FIG. 5. Instead of providing the constant current source $I_{S3}$, a constant current source $I_{S4}$ and a NMOS transistor $MN_9$ are provided. A source of the NMOS transistor $MN_9$ is connected to the ground line 8, and a drain thereof is connected to the constant current source $I_{S4}$. A gate of the NMOS transistor $MN_9$ is connected to the drain thereof and is also connected in common to the gates of the NMOS transistors $MN_3$ and $MN_4$. The bias voltage supplied to the gates of the NMOS transistors $MN_3$ and $MN_4$ is generated by the constant current source $I_{S4}$ and the NMOS transistor $MN_9$.

What is claimed is:

1. A differential amplifier circuit comprising:
    an NMOS transistor pair connected with a non-inversion input terminal and an inversion input terminal;
    a PMOS transistor pair connected with said non-inversion input terminal and said inversion input terminal; and
    an output circuit section,
    wherein said PMOS transistor pair comprises first and second PMOS transistors,
    wherein said NMOS transistor pair comprises first and second non-doped type NMOS transistors as a depletion type of NMOS transistors in which a channel region is formed in a P-type substrate without a P well, and
    wherein said output circuit section comprises a first current mirror of a folded cascode type connected with said first and second non-doped type NMOS transistors, and outputs an output voltage in response to a current from said first current mirror.

2. The differential amplifier circuit according to claim 1, wherein a threshold voltage of said non-doped type NMOS transistor is in a range of −0.2 to 0 V.

3. The differential amplifier circuit according to claim 1, wherein said first current mirror comprises third to sixth PMOS transistors,
wherein said third and fourth PMOS transistors have source connected in common to a power supply line, gates connected in common, and drains respectively connected with sources of said fifth and sixth PMOS transistors,
wherein first bias voltage is applied to gates of said fifth and sixth PMOS transistors in common,
wherein a drain of said fifth PMOS transistor is connected in common to the gates of said third and fourth PMOS transistors,
wherein said first and second non-doped type NMOS transistors have sources connected in common to a first current source, drains respectively connected with the drains of said fourth and third PMOS transistors, and gates respectively connected with said non-inversion input terminal and said inversion input terminal, and
wherein said output circuit section generates said output voltage in response to the current flowing from sixth PMOS transistor.

4. The differential amplifier circuit according to claim 3, wherein said output circuit section further comprises:
a second current mirror connected with said first and second PMOS transistors;
a floating current source connected between said first current mirror and said second current mirror;
a first output transistor as a PMOS transistor having a drain connected with an output terminal from which said output voltage is outputted, a gate connected with one end of said floating current source, and
a second output transistor as an NMOS transistor having a drain connected with said output terminal and a gate connected with the other end of said floating current source.

5. The differential amplifier circuit according to claim 4, wherein said second current mirror comprises third to sixth NMOS transistors,
wherein said third and fourth NMOS transistors have sources connected in common to a ground line, gates connected in common, and drains connected with sources of said fifth and sixth NMOS transistors, respectively,
wherein a second bias voltage is supplied to gates of said fifth and sixth NMOS transistors,
wherein a drain of said fifth PMOS transistor is connected in common to the gates of said third and fourth PMOS transistors,
wherein said first and second PMOS transistors have sources connected in common to a second current source, drains connected with drains of said fourth and third NMOS transistors, and gates connected with said non-inversion input terminal and said inversion input terminal, respectively,
wherein a third current source is connected between the drain of said fifth NMOS transistor and the drain of said fifth PMOS transistor,
wherein said floating current source comprises a seventh PMOS transistor having a gate to which a third bias voltage is supplied and a seventh NMOS transistor having a gate to which a fourth bias voltage is supplied,
wherein said seventh PMOS transistor has a source connected with the drain of said sixth PMOS transistor with a drain connected with said seventh NMOS transistor, and
wherein said seventh NMOS transistor has a drain connected with the drain of said sixth PMOS transistor and a source connected with the drain of said sixth NMOS transistor.

6. A data line driver comprising:
a D/A (digital-to-analog) converter configured to output a gray scale voltage corresponding to a display data; and
a differential amplifier circuit comprising an output terminal connected with a data line of a liquid crystal display panel, and having a non-inversion input terminal connected with said gray scale voltage and an inversion input terminal connected with said output terminal,
wherein said differential amplifier circuit comprises:
an NMOS transistor pair connected with said non-inversion input terminal and said inversion input terminal;
a PMOS transistor pair connected with said non-inversion input terminal and said inversion input terminal; and
an output circuit section,
wherein said PMOS transistor pair comprises first and second PMOS transistors,
wherein said NMOS transistor pair comprises first and second non-doped type NMOS transistors as a depletion type of NMOS transistors in which a channel region is formed in a P-type substrate without a P well, and
wherein said output circuit section comprises a first current mirror of a folded cascode type connected with said first and second non-doped type NMOS transistors, and output an output voltage to said output terminal in response to a current from said first current mirror.

7. The data line driver according to claim 6, wherein a threshold voltage of said non-doped type NMOS transistor is in a range of −0.2 to 0 V.

8. The data line driver according to claim 6, wherein said first current mirror comprises a third to sixth PMOS transistors,
wherein said third and fourth PMOS transistors have source connected in common to a power supply line, gates connected in common, and drains respectively connected with sources of said fifth and sixth PMOS transistors,
wherein first bias voltage is applied to gates of said fifth and sixth PMOS transistors in common,
wherein a drain of said fifth PMOS transistor is connected in common to the gates of said third and fourth PMOS transistors,
wherein said first and second non-doped type NMOS transistors have sources connected in common to a first current source, drain respectively connected with the drains of said fourth and third PMOS transistors, and gates respectively connected with said non-inversion input terminal and said inversion input terminal, and
wherein said output circuit section generates said output voltage in response to the current flowing from sixth PMOS transistor.

9. The data line driver according to claim 8, wherein said output circuit section further comprises:
a second current mirror connected with said first and second PMOS transistors;
a floating current source connected between said first current mirror and said second current mirror;

a first output transistor as a PMOS transistor having a drain connected with said output terminal from which said output voltage is outputted, a gate connected with one end of said floating current source, and a second output transistor as an NMOS transistor having a drain connected with said output terminal and a gate connected with the other end of said floating current source.

10. The data line driver according to claim 9, wherein said second current mirror comprises third to sixth NMOS transistors, wherein said third and fourth NMOS transistors have sources connected in common to a ground line, gates connected in common, and drains connected with sources of said fifth and sixth NMOS transistors, respectively, wherein a second bias voltage is supplied to gates of said fifth and sixth NMOS transistors, wherein a drain of said fifth PMOS transistor is connected in common to the gates of said third and fourth PMOS transistors, wherein said first and second PMOS transistors have sources connected in common to a second current source, drains connected with drains of said fourth and third NMOS transistors, and gates connected with said non-inversion input terminal and said inversion input terminal, respectively, wherein a third current source is connected between the drain of said fifth NMOS transistor and the drain of said fifth PMOS transistor, wherein said floating current source comprises a seventh PMOS transistor having a gate to which a third bias voltage is supplied and a seventh NMOS transistor having a gate to which a fourth bias voltage is supplied, wherein said seventh PMOS transistor has a source connected with the drain of said sixth PMOS transistor with a drain connected with said seventh NMOS transistor, and wherein said seventh NMOS transistor has a drain connected with the drain of said sixth PMOS transistor and a source connected with the drain of said sixth NMOS transistor.

11. A liquid crystal display apparatus comprising:
a liquid crystal display panel; and
a data line driver configured to drive a data line of said liquid crystal display panel,
wherein said data line driver comprises:
a D/A (digital-to-analog) converter configured to output a gray scale voltage corresponding to a display data; and
a differential amplifier circuit comprising an output terminal connected with said data line of a liquid crystal display panel, and having a non-inversion input terminal connected with said gray scale voltage and an inversion input terminal connected with said output terminal,
wherein said differential amplifier circuit comprises:
an NMOS transistor pair connected with said non-inversion input terminal and said inversion input terminal;
a PMOS transistor pair connected with said non-inversion input terminal and said inversion input terminal; and
an output circuit section,
wherein said PMOS transistor pair comprises first and second PMOS transistors,
wherein said NMOS transistor pair comprises first and second non-doped type NMOS transistors as a depletion type of NMOS transistors in which a channel region is formed in a P-type substrate without a P well, and wherein said output circuit section comprises a first current mirror of a folded cascode type connected with said first and second non-doped type NMOS transistors, and outputs an output voltage to said output terminal in response to a current from said first current mirror.

12. The liquid crystal display apparatus according to claim 11, wherein a threshold voltage of said non-doped type NMOS transistor is in a range of −0.2 to 0 V.

13. The liquid crystal display apparatus according to claim 11, wherein said first current mirror comprises third to sixth PMOS transistors, wherein said third and fourth PMOS transistors have source connected in common to a power supply line, gates connected in common, and drains respectively connected with sources of said fifth and sixth PMOS transistors, wherein first bias voltage is applied to gates of said fifth and sixth PMOS transistors in common, wherein a drain of said fifth PMOS transistor is connected in common to the gates of said third and fourth PMOS transistors, wherein said first and second non-doped type NMOS transistors have sources connected in common to a first current source, drains respectively connected with the drains of said fourth and third PMOS transistors, and gates respectively connected with said non-inversion input terminal and said inversion input terminal, and wherein said output circuit section generates said output voltage in response to the current flowing from sixth PMOS transistor.

14. The liquid crystal display apparatus according to claim 13, wherein said output circuit section further comprises:

a second current mirror connected with said first and second PMOS transistors;

a floating current source connected between said first current mirror and said second current mirror;

a first output transistor as a PMOS transistor having a drain connected with said output terminal from which said output voltage is outputted, a gate connected with one end of said floating current source, and a second output transistor as an NMOS transistor having a drain connected with said output terminal and a gate connected with the other end of said floating current source.

15. The liquid crystal display apparatus according to claim 14, wherein said second current mirror comprises third to sixth NMOS transistors, wherein said third and fourth NMOS transistors have sources connected in common to a ground line, gates connected in common, and drains connected with sources of said fifth and sixth NMOS transistors, respectively, wherein a second bias voltage is supplied to gates of said fifth and sixth NMOS transistors, wherein a drain of said fifth PMOS transistor is connected in common to the gates of said third and fourth PMOS transistors, wherein said first and second PMOS transistors have sources connected in common to a second current source, drains connected with drains of said fourth and third NMOS transistors, and gates connected with said non-inversion input terminal and said inversion input terminal, respectively, wherein a third current source is connected between the drain of said fifth NMOS transistor and the drain of said fifth PMOS transistor, wherein said floating current source comprises a seventh PMOS transistor having a gate to which a third bias voltage is supplied and a seventh NMOS transistor having a gate to which a fourth bias voltage is supplied, wherein said seventh PMOS transistor has a source connected with the drain of said sixth PMOS transistor with a drain connected with said seventh NMOS transistor, and wherein said seventh NMOS transistor has a drain connected with the drain of said sixth PMOS transistor and a source connected with the drain of said sixth NMOS transistor.

\* \* \* \* \*